United States Patent [19]
McAdams

[11] Patent Number: 5,270,975
[45] Date of Patent: Dec. 14, 1993

[54] MEMORY DEVICE HAVING A NON-UNIFORM REDUNDANCY DECODER ARRANGEMENT

[75] Inventor: Hugh McAdams, Houston, Tex.

[73] Assignee: Texas Instruments Incorporated, Dallas, Tex.

[21] Appl. No.: 928,634

[22] Filed: Aug. 13, 1992

Related U.S. Application Data

[63] Continuation of Ser. No. 714,321, Jun. 11, 1991, abandoned, which is a continuation of Ser. No. 501,064, Mar. 29, 1990, abandoned.

[51] Int. Cl.$^5$ .............. G11C 7/00; G11C 29/00; G06F 11/20
[52] U.S. Cl. .............. 365/200; 365/230.06; 365/230.03; 371/10.1; 371/10.3
[58] Field of Search .............. 365/200, 230.03, 230.06; 371/10.1, 10.2, 10.3

[56] References Cited

U.S. PATENT DOCUMENTS

| | | | |
|---|---|---|---|
| 4,471,472 | 9/1984 | Young | 365/200 |
| 4,653,050 | 3/1987 | Vaillancourt | 365/200 |
| 4,672,581 | 6/1987 | Waller | 365/200 |
| 4,691,301 | 9/1987 | Anderson | 365/200 |
| 4,807,191 | 2/1989 | Flannagan | 365/200 |
| 4,847,810 | 7/1989 | Tagami | 365/200 |

FOREIGN PATENT DOCUMENTS 0040700 2/1987 Japan .................. 371/10.2

Primary Examiner—Glenn Gossage
Attorney, Agent, or Firm—Robby T. Holland; Lawrence J. Bassuk; Richard B. Havill

[57] ABSTRACT

A memory device including a non-uniform redundancy decoder has one or more data blocks with each data block having an array of memory cells arranged in addressable rows and columns along row lines and column lines. Each array is configured into sub-blocks with each sub-block comprising a plurality of the memory cells. A given number of repair columns is allocated to a data block. A plurality of column repair decoder circuits are each connected to a repair column. These column repair decoder circuits are programmable with column and row address information corresponding to a section of an array column contianing a defective memory cell to replace the defective cell with a memory cell in one of the repair columns. Different numbers of column repair decoder circuits are connected to the first and second column repair circuits, thereby creating a nonuniform distribution of column repair circuits. A method of assigning the nonuniform redundancy decoders is also disclosed.

8 Claims, 16 Drawing Sheets

% Repairable vs Number of defects per die vs Number of Row Addresses per redundant decoder for [4][3][1] redundancy scheme % Repairable vs Number of defects per die vs Number of Row Addresses per redundant decoder for [5][2][1] redundancy scheme

MEMORY DEVICE HAVING A NON-UNIFORM REDUNDANCY DECODER ARRANGEMENT

This application is a continuation of application Ser. No. 07/714,321 filed Jun. 11, 1991, now abandoned; which is a continuation of application Ser. No. 07/501,064 filed Mar. 29, 1990, also now abandoned.

The present invention relates to semiconductor memory devices and, more particularly, to devices which include repair circuitry for eliminating defects in memory devices.

BACKGROUND OF THE INVENTION

In the fabrication of semiconductor memory devices, it is common for an array of memory cells to include one or more defects which prevent the proper performance of the memory circuit. If a type of defect occurs systematically it can often be causally analyzed and designed out. Other defects which are generally not systematic include short circuits between adjacent columns and open circuits within individual columns of memory cells. For analysis purposes, the distribution of such defects in a memory device, as well as the distribution of the number of defects among a given production lot, may be considered random so that the yield of good devices in a lot can be modelled according to a Poisson distribution function. Typically, over the period of time that a particular device or family of devices is being produced in a given manufacturing facility, the product yield can be improved by removing causes, e.g., particulate matter, of the above-mentioned random defects.

In many fabrication processes, the causes of random defects cannot be completely eliminated and it is desirable to further improve the yield of memory devices with redundant circuitry. During testing of a chip, defective memory cells can be identified and replaced. Such redundancy techniques are especially suited for semiconductor memories because large numbers of repeating elements are arranged in columns and rows. This array format lends itself to replacement of a defective column or row with any of multiple identical redundant columns or rows.

A redundant circuit scheme may be implemented with a plurality of universal decode circuits connected to the redundant columns. To activate the redundant circuitry, appropriate fuses ar included for programming individual decoder circuits to be responsive to the addresses of defective memory cells. For example, in dynamic random access memory devices (DRAM's), address integrity can be maintained by simply programming redundant column circuits to respond to defective column addresses. Thus, the address of each defective column is assigned to a redundant column circuit. In video and frame memory circuits, the replacement procedure may require greater complexity in order to maintain the sequential nature of memory output. See U.S. Pat. No. 4,598,388 assigned to the assignee of the present invention.

Semiconductor memories of all types are being made with progressively higher bit densities and smaller cell sizes as the density of integrated memory circuits increases. In 1972, 4K bit DRAMs were being designed, while in 1982, one megabit devices were planned. Sixteen megabit device densities will become mass produced during the 1990's. As memory capacity continues to progress, there must be further improvement in associated performance parameters such as memory access time. As a result memory architectures, which have already become relatively complex, are likely to become even more elaborate as device densities increase.

In order to improve performance, it is now commonplace to partition higher density memory arrays into logical data blocks wherein all cells associated with a particular block have common I/O paths. With this arrangement, data blocks in an array can be individually accessed. Accordingly, each data word, e.g., possibly 16 or 32 bits wide in a 64 Megabit device, could be stored entirely within one of the blocks so that the entire word can be retrieved from the memory at a given time. Thus, there is no loss in availability of data. Advantageously, the blocks in a partitioned array have shorter signal paths, smaller propagation delays and hence faster access times. Further, since only one of many blocks is accessed at a time, the overall device power consumption is also reduced.

Such partitioning requires that at least some of the support circuitry, which functions to select desired memory locations as well as to sense and maintain data states, be repeated for each data block. When the concept of internally partitioning a memory array into smaller logical data blocks was introduced, the memory densities were lower than now achievable and repetition of support circuitry for each data block was an acceptable cost in view of the above-noted performance benefits. That is, the resulting increase in chip size over that required for a slower, more power consuming array design was not critical.

Now, with the development of even denser memory devices, the requisite reduction in feature sizes renders these circuits susceptible to defects caused by particulate matter which previously caused no problems in the fabrication process. Thus, with further improvements in circuit density, there will be a greater challenge to eliminate random-type defects. Accordingly, greater reliance may be placed on redundant circuit repair schemes.

In theory, by providing a sufficient number of redundant circuits on a device, all column defects of the type described above would be repairable in order to maximize the yield of a production lot. Practically, however, cost effectiveness usually dictates that space constraints will limit the quantity of redundant circuits to be placed on each integrated circuit. It is undesirable to increase repair circuitry in proportion to memory density.

SUMMARY OF THE INVENTION

In the past, redundancy schemes have consisted of only a few extra rows and columns in order to replace up to a predetermined maximum number of defective elements. As long as each logical data block of an internally partitioned memory device included separate address circuitry, the inclusion of sufficient redundant row and column lines within these data blocks did not present difficulties.

Now, due to cost constraints which limit the package size of higher density circuits, it is undesirable to repeat for each memory data block all of the support circuitry needed to replace defective cells. By way of example, redundant column select circuitry need not be repeated for each data block. In fact, it is more space efficient to generate the repair column select signals for all of the data blocks with one series or bank of decoder circuits.

Although sharing of support circuitry among data blocks results in significant saving of space for a circuit layout, it is now recognized that such schemes both complicate and reduce the efficiency of prior art repair techniques.

It is an object of the invention to provide a redundancy scheme which includes a predetermined number of decoder circuits and is more space efficient or more effective than other redundancy schemes having the same number of decoder circuits.

According to the invention, a method is provided for maximizing the repair efficiency of a redundancy scheme wherein a given number of redundant or repair columns are allocated to a data block of memory cells. The method involves assigning multiple decoders to each of the redundant select lines so that each line is capable of replacing multiple defective column portions with multiple redundant column portions which are enabled by the same redundant column select line. A nonuniform distribution of decoder circuits among the redundant select lines improves the efficiency of repair and leads to space saving economies.

There is also provided a method for eliminating a defect in a memory device having a logical data block formed with an array of addressable memory cells formed in rows and columns. A defect associated with a first of the columns of cells is eliminated by programming a portion of a first repair (redundant) column of cells or a portion of a second repair column of cells to be responsive to the addresses of a portion of the cells in the first column. The number of portions of the first repair column of cells which can be allocated to effect multiple repairs among the array columns differs from the number of portions of the second repair column of cells which can be allocated to effect multiple repairs among the array columns.

In a preferred embodiment of the invention, there is provided a redundancy scheme, as well as a method for developing a redundancy scheme, resulting in improved device repairability for given space constraints. A memory device is formed with a plurality of data blocks having individual input/output paths. Each block comprises an array of memory cells arranged in addressable rows and columns along row lines and column lines. The array is configured in sub-blocks each comprising a plurality of the memory cells. A second group of memory cells is arranged along the row and column lines of a data block array to provide at least first and second repair columns for the array columns. The device includes row address circuitry for selecting a row of the memory cells, column address circuitry for selecting a column of the memory cells and address repair circuitry.

The address repair circuitry includes a plurality of column repair decoder circuits each connected to a repair column and each programmable with column and row address information corresponding to a section of an array column containing a defective memory cell. With this programming, memory cells in a segment of a repair column can replace memory cells in a segment of an array column containing a defective memory cell. The number of decoder circuits allocated to different repair columns is nonuniform.

According to one example of the preferred embodiment a memory device is formed with a plurality of logical data blocks each having individual input/output paths. One of the blocks comprises an array of memory cells arranged in rows and columns and configured in sub-blocks. Each sub-block includes a plurality of memory cells arranged in rows and subcolumns. The block also contains row address circuitry for selecting a row of memory cells and column address circuitry for selecting a memory cell in a column which intersects a selected row. A second group of memory cells is arranged in a plurality of repair columns. Each repair column includes a repair subcolumn for each sub-block of memory cells in the logical data block. Address repair circuitry is provided for replacing subcolumns in the array with repair subcolumns. The repair circuitry includes a plurality of programmable repair column decoders for selecting a repair subcolumn or a segment of multiple repair subcolumns based on row and column address information. The number of decoders allocated to different repair columns is nonuniform.

With this scheme, incorporating a level of row decoding in the repair column decoders, portions of redundant columns can be allocated to replace portions of array columns containing defective memory cells. Thus, with multiple decoders, a single redundant column can be utilized to replace multiple defects occurring in different array columns.

BRIEF DESCRIPTION OF THE DRAWINGS

The invention may be best understood by reference to the following detailed description of a preferred embodiment when read in conjunction with the accompanying drawings, wherein.

DETAILED DESCRIPTION OF THE INVENTION

Figure 1:
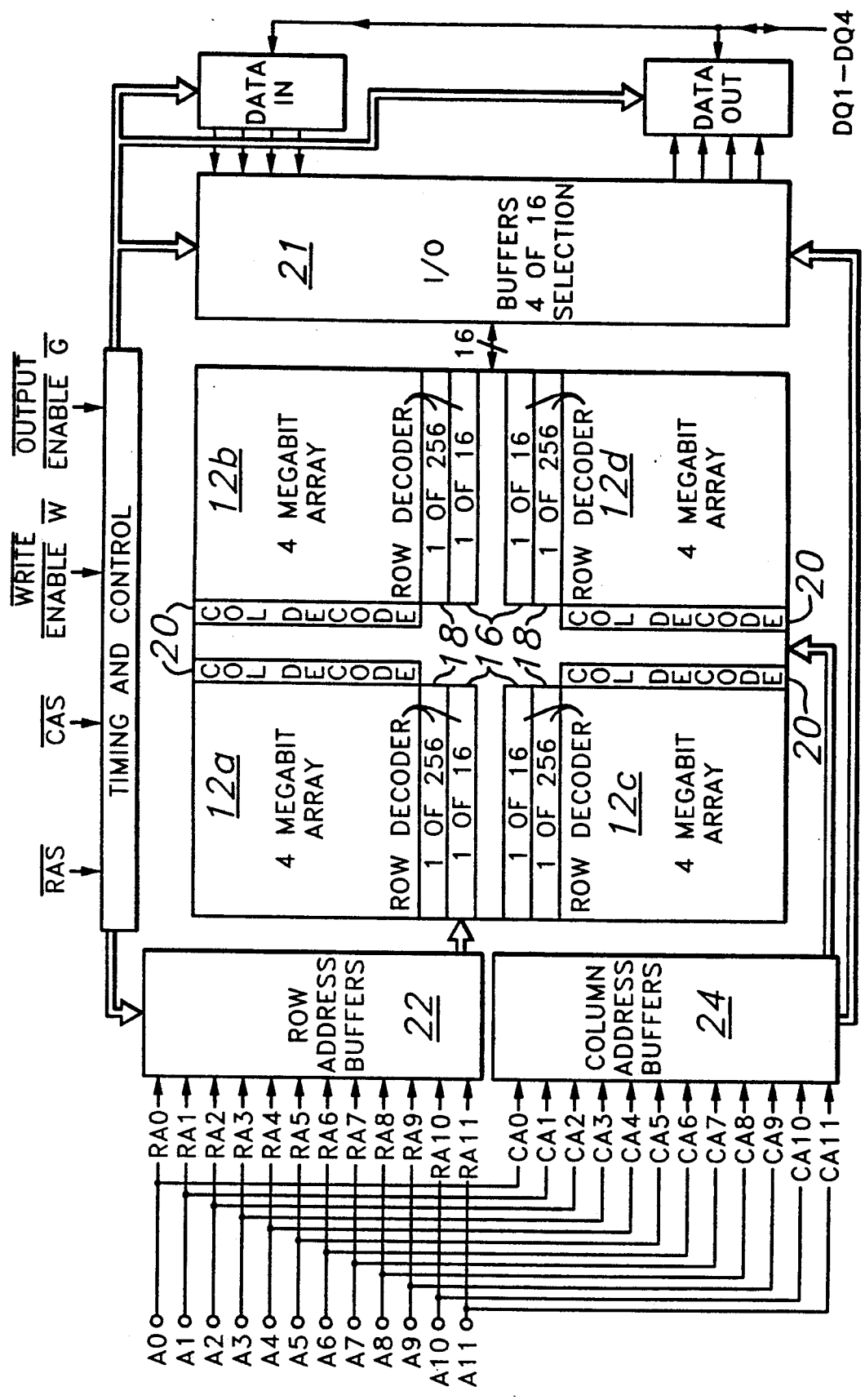
FIG. 1 is a plan view of a memory device which may incorporate the invention.

The block diagram of FIG. 1 illustrates a semi-conductor memory device with which the invention may be practiced. This exemplary device 10 is a DRAM of the so-called 16 Megabit size, having $2^{24}$ or 16,777,216 one-transistor storage cells arranged in rows and columns. According to a preferred architecture, the device is partitioned into four identical logical data blocks 12, individually designated 12a, 12b, 12c and 12d. Each block 12 is of the four megabit size, comprising 4,194,304 memory cells arranged in an array of 4,096 rows and 1,024 columns C. The row address strobe signal $\overline{RAS}$, the column address strobe signal $\overline{CAS}$, the write enable signal $\overline{W}$, and the output enable signal $\overline{G}$ control operations within DRAM 10. These signals are received by the timing and control circuits of the memory device. The read or write mode of the device is selected through the write enable signal $\overline{W}$. A logic high on $\overline{W}$ selects the read mode while a logic low on $\overline{W}$ selects the write mode. The impedance of the output buffers is controlled by the output enable signal $\overline{G}$. When $\overline{G}$ is high, the buffers will remain in the high-impedance state. Bringing $\overline{G}$ low during a normal cycle will activate the output buffers putting them in the low-impedance state.

Figure 2:
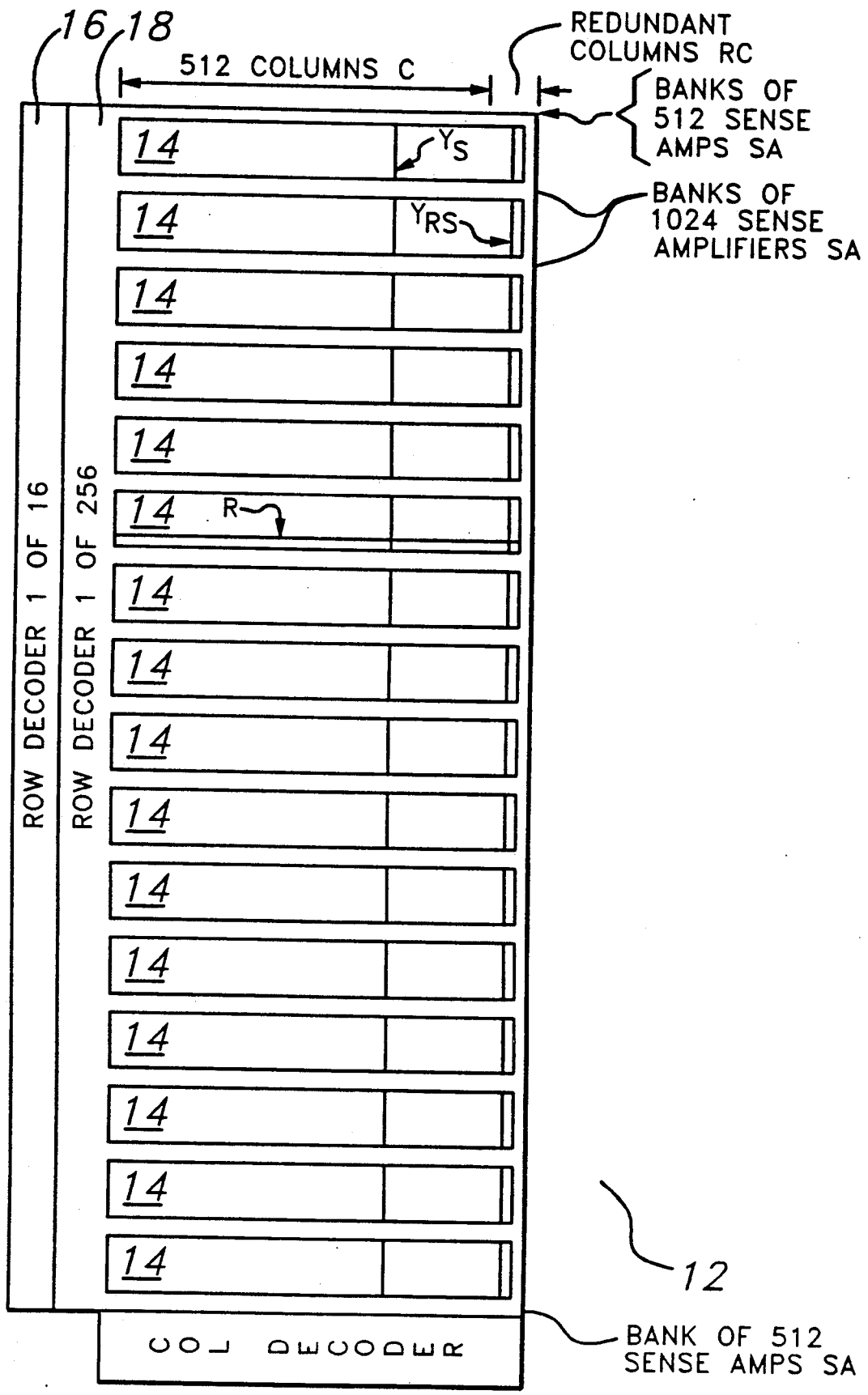
FIG. 2 illustrates the general layout of a logical data block in the device of FIG. 1.
Figure 3:
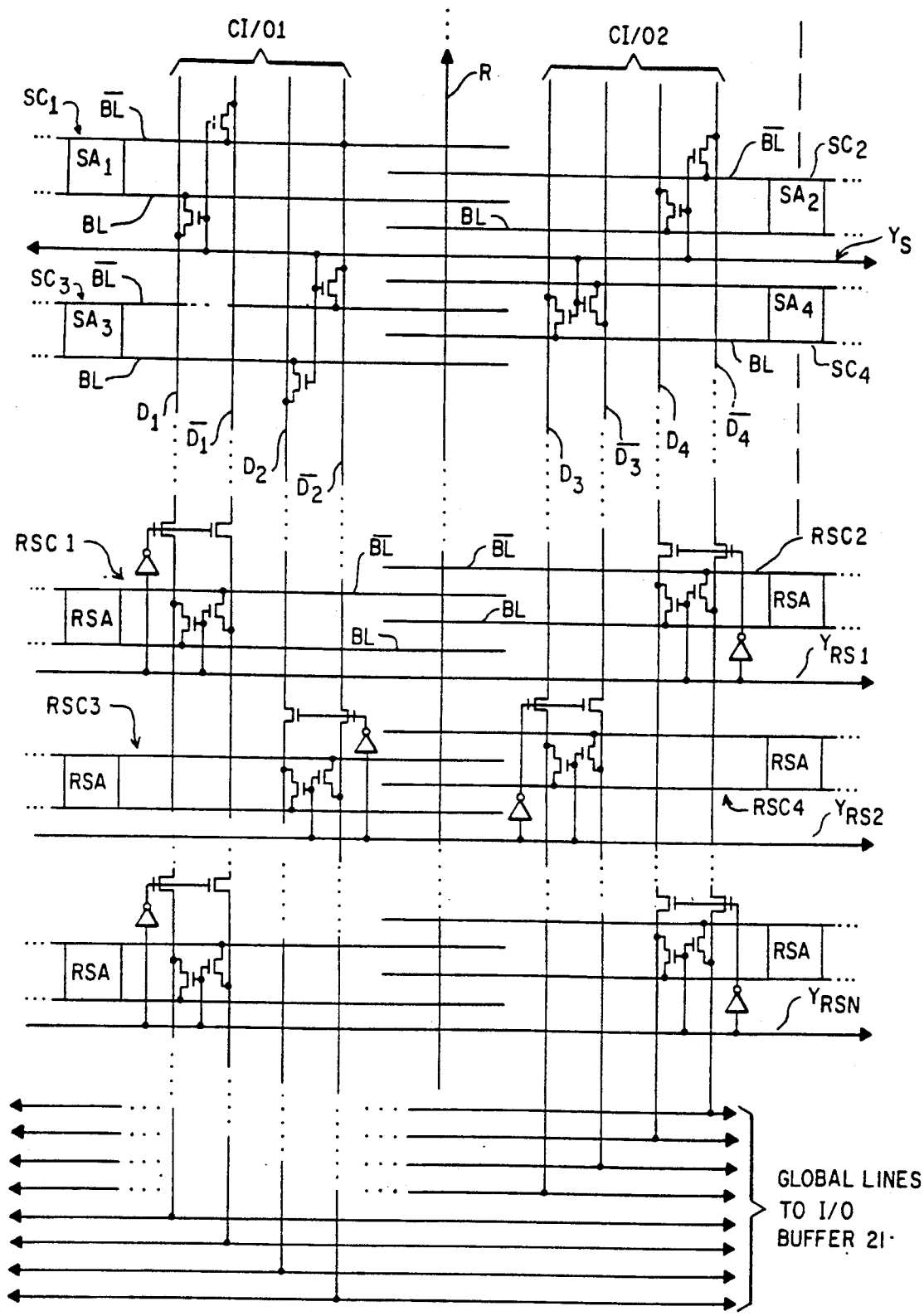
FIG. 3 is a partial view of a sub-block of one of the data blocks.
Figure 4:
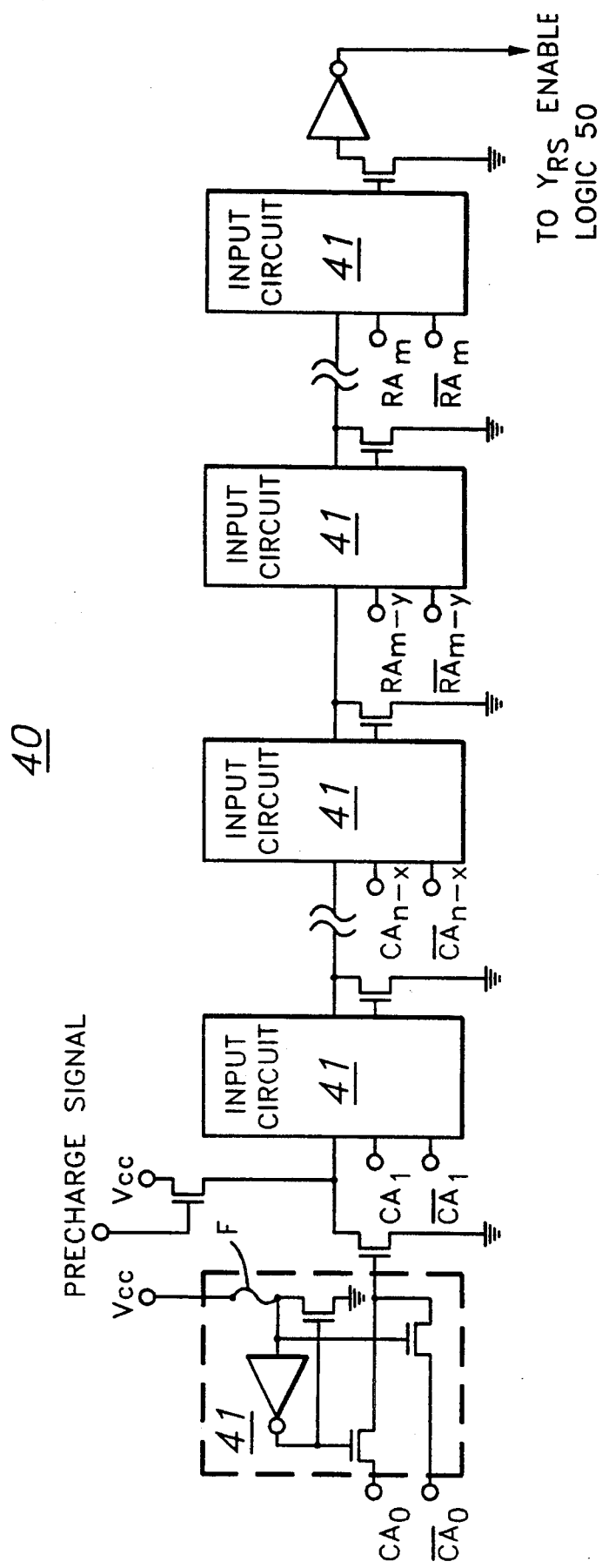
FIG. 4 schematically illustrates a fusible comparator decoder according to the invention.

Circuit details of the device 10 which are helpful to understanding the invention are illustrated in FIGS. 2, 3 and 4. As indicated in FIG. 2, each data block 12 is partitioned into sixteen sub-blocks 14. The portion of a column C within each sub-block 14 is formed as a pair of interdigitated subcolumns SC. See FIG. 3. Thus 1024 pairs of subcolumns are in each sub-block. Banks of sense amplifiers SA border upper and lower opposing sides of each sub-block.

The partial view of FIG. 3 illustrates two adjacent pairs of interdigitated subcolumns SC. The first pair comprises subcolumns $SC_1$ and $SC_2$ and the second pair comprises subcolumns $SC_3$ and $SC_4$. Each of the pairs of subcolumns is associated with one of two adjacent columns in the sub-block. As is common in high density DRAM devices, the subcolumns are arranged in a folded bitline configuration. Thus, each subcolumn SC comprises two bitline segments BL and $\overline{BL}$ with each containing memory cells and connected to the same sense amplifier SA. The two subcolumns within the sub-block 14, that are associated with the same column C, are coupled to different sense amplifiers SA on opposing sides of the sub-block 14. Except for the outermost banks of sense amplifiers in the data block 12, (i.e., those situated along the outer sides of the first and last of the sixteen sub-blocks), each bank of sense amplifiers is shared by sub-columns in an adjacent pair of sub-blocks.

Within each sub-block 14, there are 256 row or word lines R and 256 column select lines $Y_S$. For simplicity of illustration, only one row line R and one column select line $Y_S$ are shown in FIG. 3. A row line is selectable based on row address information input to a one of sixteen row decoder stage 16 and a one of 256 row decoder stage 18. In each data block 12, column address decoders 20 turn on a select line $Y_S$ to control read-/write data transfer for two columns.

The four sub-columns in a sub-block that are associated with each select line $Y_S$ are grouped in pairs for independent and parallel data I/O along one of two, 2-bit wide, local data paths $C_{I/O}$. FIG. 3 illustrates two such paths, designated $C_{I/O1}$ and $C_{I/O2}$. Path $C_{I/O1}$ comprises two pairs of data lines $D_1$, $\overline{D_1}$ and $D_2$, $\overline{D_2}$ with each pair providing one bit of information. Similarly, path $C_{I/O2}$ comprises two pairs of data lines $D_3$, $\overline{D_3}$ and $D_4$, $\overline{D_4}$.

Lines $D_1$, $D_2$, $D_3$ and $D_4$ are connected to receive signals from bitline segments BL and lines $\overline{D_1}$, $\overline{D_2}$, $\overline{D_3}$ and $\overline{D_4}$ are connected to receive complementary signals from bitline segments $\overline{BL}$. Thus, each pair of bitlines, in the four sub-columns of a sub-block that are associated with a particular select line $Y_S$, is paired to one of the data line pairs $D_i$, $\overline{D_i}$. A four-bit wide global data path connects the local paths in each sub-block 14 of a logical data block 12 to the data I/O buffers 21. Thus, when a row of memory cells in a particular sub-block is addressed and a select line $Y_S$ is also addressed, data is simultaneously transferred between four memory cells within two adjacent pairs of sub-columns SC and the I/O buffers 21.

For this exemplary DRAM embodiment, the row decoding arrangement enables simultaneous transfer of data to or from one sub-block 14 in each of the four data blocks 12 at a given time. The column select arrangement provides X 4 output from each data block 12. Thus, the I/O buffers 21 could provide 16 bit parallel I/O.

During a data transfer operation, row address signals RA0 through RA11 and column address signals CA0 through CA11 are input in conventional time-multiplexed manner. They are latched into row and column address buffers 22 and 24 according to timing signals $\overline{RAS}$ and $\overline{CAS}$. See FIG. 1. Based on 4 bits of row address information RA0 through RA3, the first row decoder stage 16 selects one of the 16 sub-blocks in each of the data blocks 12. The second row decoder stage 18 selects one of the 256 rows within each selected sub-block based on the remaining 8 bits of row address information RA4 through RA11. The decoder circuitry 20 receives eight bits of column address data, A0 through A7, to provide a logic-high signal along one of the 256 select lines $Y_S$ in a data block 12. With this selection, the data block provides four bits of data on a pair of 2-bit paths $C_{I/O}$ associated with the accessed sub-block. The next two bits of column address data, CA8 and CA9, can be applied in any of several well known decoder circuit arrangements to vary the output of the data block from X 1 to X 4.

The memory array of each data block 12 includes, in addition to the 4,194,304 cells arranged along 1024 columns C, a predetermined number of redundant columns RC. Data I/O of the memory cells in each column RC is controlled by a redundant column select line. One redundant column select line $Y_{RS}$ is illustrated in FIG. 2. In principle, the number of redundant columns RC provided in each data block can be sufficient to maximize the yield of a production lot. On the other hand, given typical space constraints, it is desirable that individual data blocks in the device 10 comprise less than five redundant select lines $Y_{RS}$.

As further illustrated for the sub-block 14 of FIG. 3, the redundant columns RC are formed as pairs of redundant sub-columns RSC and a redundant column select line $Y_{RS}$ is connected to access data from each column pair. All of the sub-blocks 14 in a data block 12 include the same number of redundant column selects.

Recalling that the four sub-columns SC associated with each select line $Y_S$ in a sub-block 14 are also arranged in pairs, portions of each pair of redundant columns can be wired to replace one or more portions of a pair of subcolumns in a column C. In order to substitute defective memory cells with functioning cells, memory cells in each redundant column are arranged along the 4,096 rows of a data block 12 with each cell connected to a different row line so that all cells in a redundant column can be accessed with the row address decoder stages 16 and 18.

As schematically illustrated in FIG. 3, each redundant select line $Y_{RS}$ enables data transfer between each of two constituent subcolumns RSC in a sub-block and a pair of data lines $D_i$, $\overline{D_i}$ associated with each of the paths $C_{I/O1}$ and $C_{I/O2}$. More specifically, a logic-high signal on redundant select line $Y_{RS1}$ connects each pair of folded bitline segments in the two selected redundant sub-columns $RSC_1$ and $RSC_2$ to the pairs of data lines $\overline{D_1}$, $D_1$ and $D_4$, $\overline{D_4}$. For example, a logic high signal on select line $Y_{RS1}$ will connect the bitline segments of $RCS_1$ to data lines $D_1$ and $\overline{D_1}$ and will connect the bitline segments of $RCS_2$ to data lines $D_4$ and $\overline{D_4}$. During this transfer period, all of the sub-columns SC in the sub-block 14 are disconnected from $\overline{D_1}$, $D_1$ and $D_4$, $\overline{D_4}$. Similarly, a logic high signal on select line $Y_{RS2}$ will connect the bitline segments of $RCS_3$ to data lines $D_2$ and $\overline{D_2}$ and will connect the bitline segments of $RCS_4$ to data lines $D_3$ and $\overline{D_3}$.

With this arrangement, column repair decode circuitry can advantageously incorporate a level of row decoding in order to replace defective sections of columns C with equivalent sections of redundant columns RC. In a simple implementation of this replacement procedure, corresponding sections of columns C and redundant columns RC are responsive to the same level of row decoding. For the device 10, a comparator is programmed to replace a subcolumn pair, or a column segment of subcolumn pairs spanning multiple sub-blocks 14, with a corresponding section of a redundant column.

Such segmentation is useful for allocating two or more portions of the same redundant column for repair of multiple defects occuring in different column segments, e.g., occurring in sections of memory having different column addresses. In the example implementation of the replacement procedure for the device 10, for a given level of row decoding, each pair of column sections which is to be replaced must be identifiable with different row address data. When two or more defective sections in different pairs of column sections are identified with the same row address information, a different redundant column RC will be required to replace each of these. Otherwise, as long as sufficient row decoding is provided to associate each of the column sections which is to be replaced with a different section in the repair column, a single redundant column can be segmented to replace all column sections containing the defects in a data block 12. Generally, one redundant column RC can be used to eliminate defects occuring in multiple columns.

The feature of decoding row address information in the column repair circuitry increases the number of repairs which can be made with a given number of redundant columns RC. For example, with a one of fifteen comparator decoder (receiving eight bits of column and three bits of row address information) any one of 8 segments in a redundant column RC can be programmed to replace any one of eight corresponding column segments in any of the four data blocks 12. Alternately, with a one of sixteen comparator decoder (receiving eight bits of column and four bits of row address information) the redundant columns RC can be segmented into sixteen sections each corresponding to a different pair of sub-columns SC in a different one of sixteen sub-blocks 14.

To effect substitution of redundant column cells for defective cells, the column repair decode circuitry includes a plurality of fusible comparator decoders 40. Typically the decoder 40, shown schematically in FIG. 4, will include a number of input circuits 41, each wired to receive an address signal and its complement. Given n column address signals provided to the address buffers 24 and m row address signals provided to the address buffers 22, the decoder 40 includes n-x input circuits for receiving column address signals and m-y input circuits for receiving row address signals. The value of x corresponds to the number of columns C in a data block 12 and the value of y will depend on the desired level of segmentation. Each address input circuit 41 includes a fuse F for programming the decoder with the row or column address information needed to substitute one segment of memory cells along one redundant select line $Y_{RS}$ in a data block for a defective segment of memory cells in a column C of the same data block.

The number of column repairs which can be made on the entire device 10 is equal in count to the total number of comparator decoders. As illustrated schematically in FIG. 5, the decoders 40 are arranged in segment select groups $SS_i$. Assuming that each data block 12 has the same number of redundant columns RC, all of the decoders 40 in a particular group $SS_i$ are wired to turn on the same redundant select line $Y_{RSi}$ (i=1,N) in all of the data blocks.

For a given level of row decoding in the decoders 40 any one of a predetermined number of sections within a repair column is addressable in the manner described above to replace a defective section along one of the 256 column select lines in any one of the four data blocks. Thus, by programming a decoder 40, a section in a redundant column is definable with a combination of row address information to replace a defective section in one of the data blocks. One of four data block select logic 42 includes a second stage of fusible decoders for identifying the data block which each decoder 40 is to be dedicated.

All of the second stage decoders in the logic block 42 include input circuits 41, like those of the decoders 40, that receive column address bits CA10 and CA11 to effect the one of four selection. Of course, in other redundancy schemes, the decoders of block 42 could provide a higher level of selection in order to allocate sections of the redundant columns RC to portions of the data blocks 12. For example, different redundant columns could be assigned to each half of each data block with the decoders in each group $SS_i$ wired to turn on the same redundant select line $Y_{RS}$ in each data half block. With this partitioning, the second stage of decoders would include fusible circuits for dedicating each decoder 40 within each group $SS_i$ to a particular half block.

Figure 5:
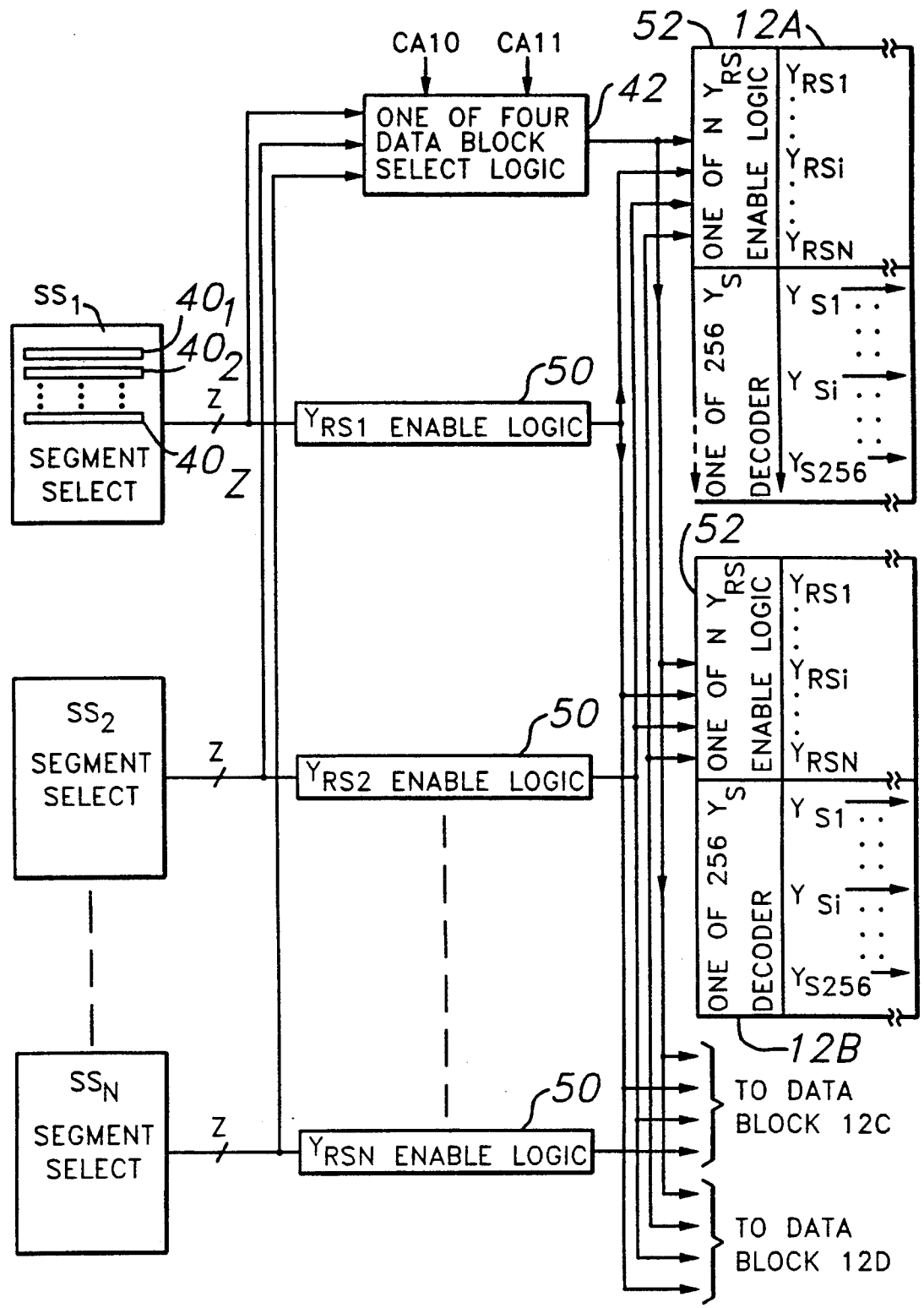
FIG. 5 illustrates, in block diagram form, a column repair scheme according to the invention.

In the present embodiment, the second stage of decoders 42 provides a one of four selection and the number of segment select groups $SS_i$ (i=1 to N) in FIG. 5 is equal to the number, N, of redundant select lines $Y_{RS}$ in each data block 12. The outputs of all the decoders 40 in each segment select group $SS_i$ are input to one of N select enable logic circuits 50. When one decoder in a group $SS_i$ outputs a logic high signal the select enable logic circuit 50 for that group outputs a logic high signal, corresponding to the associated redundant select line $Y_{RSi}$. With appropriate addressing provided to the decoders 40 and 42, each select enable logic circuit 50 provides a logic-high signal to one redundant select line $Y_{RS}$ in each data block. FIG. 5 illustrates, for two of the data blocks 12A and 12B, combinatorial logic 52 for turning on one of N redundant select lines $Y_{RS}$, based on the output of the data block select logic 42 and the enable logic circuits 50.

According to the invention, the repairability of a device containing a given number of random defects can be improved by increasing: the aggregate sum of redundant columns; the quantity of decoders to be provided for each redundant column; and the number of sections into which a column C is to be segmented for individual addressing. Commensurate with an increase in the number of sections into which a redundant column C is addressable for effecting repair of one or more columns C, a higher level of repair can be achieved with fewer redundant columns. Thus, the likelihood of device repairability will be improved by increasing the level of decoding as well as the number of decoders associated with each redundant column select line $Y_{RS}$.

FIGS. 6A through 6E portray an analysis and methodology for improving the level of defect repair for one data block 12 of the device 10. Given a fixed pattern of five defects, each figure depicts an exemplary number of individually addressable sections into which a column C can be segmented to effect replacement with a redundant column RC. For simplicity, it is assumed that each defect occurs along a different column select line $Y_S$ and in a different one of sixteen sub-blocks 14. For each of the five examples illustrated in FIG. 6, as many as five redundant select lines $Y_{RS}$ are available to effect repairs.

When no row decoding is provided by the comparator decoders (FIG. 6A), the number of decoders in each segment select group $SS_i$ degenerates to one decoder per redundant select line $Y_{RS}$. When the comparator decoders include no row decode circuitry, the columns C cannot be segmented into subsections for individual replacement. Therefore, all five redundant select lines must be allocated for repair of the five column defects.

When one bit of row decoding is incorporated in each comparator decoder (FIG. 6B), the columns can be segmented in two sections (each section covering eight of the sub-blocks 14) and the segment select groups $SS_i$ can include a maximum of two decoders per select line. Full repair is implemented with four select lines $Y_{RS}$ and five decoders. When the comparator decoders perform two bits of row decoding (FIG. 6C), the columns are segmented into four sections (each section covering four of the sub-blocks 14) and the segment select groups $SS_i$ each include up to three decoders. With the scheme of FIG. 6C, three select lines $Y_{RS}$ and five decoders will effect full repair of the data block 12.

Figure 6A:
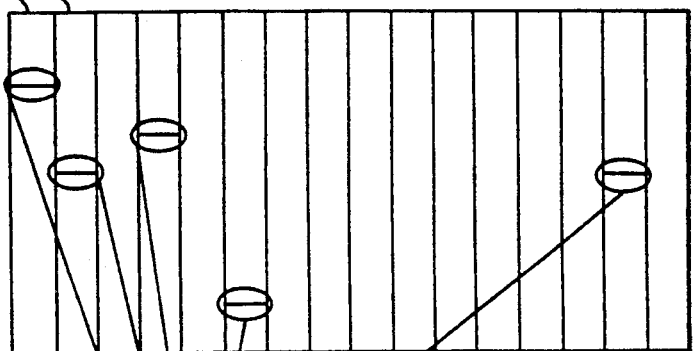
FIGS. 6A through 6E portray an analysis and methodology for improving the achievable level of column repair for a logical data block.
Figure 6A:
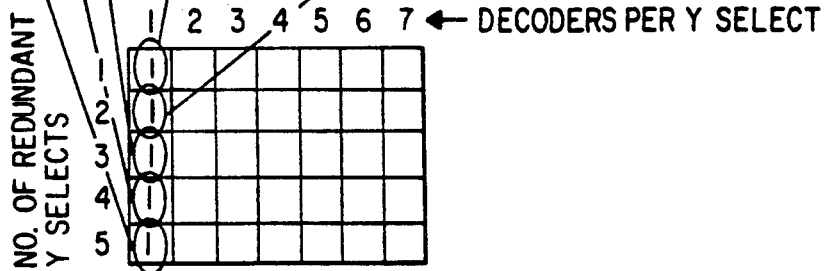
Figure 6B:
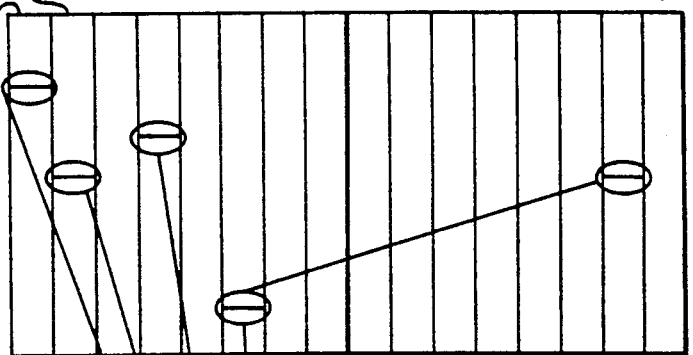
Figure 6B:
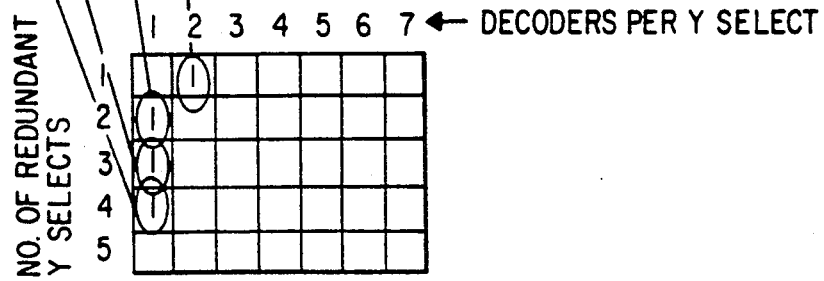
Figure 6C:
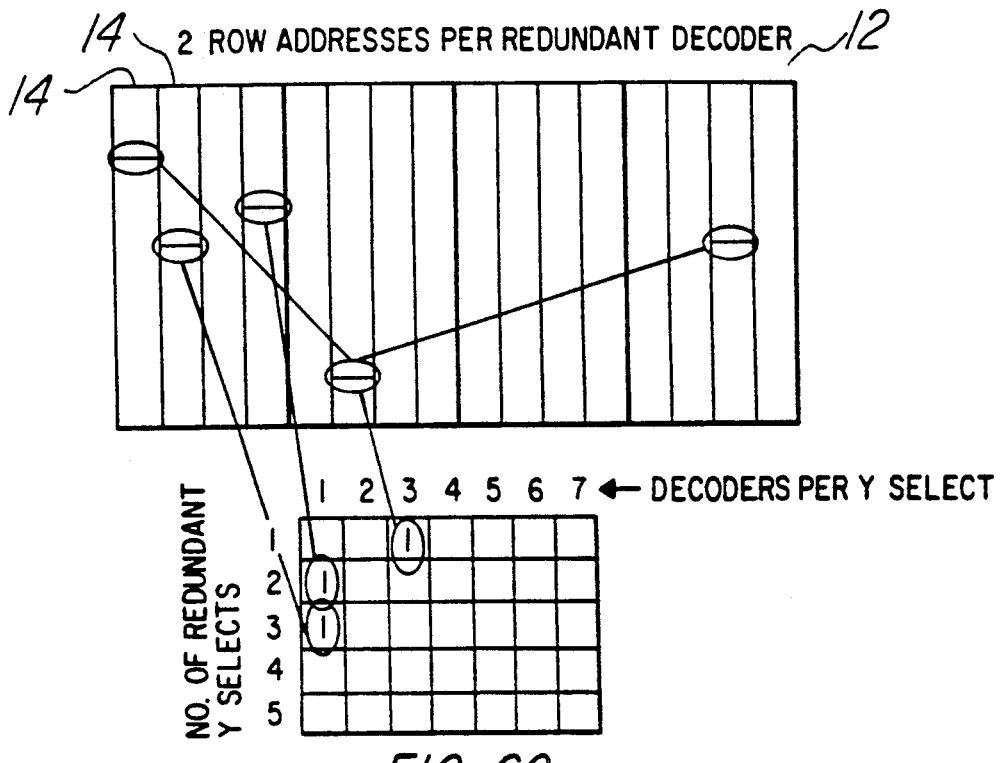
Figure 6D:
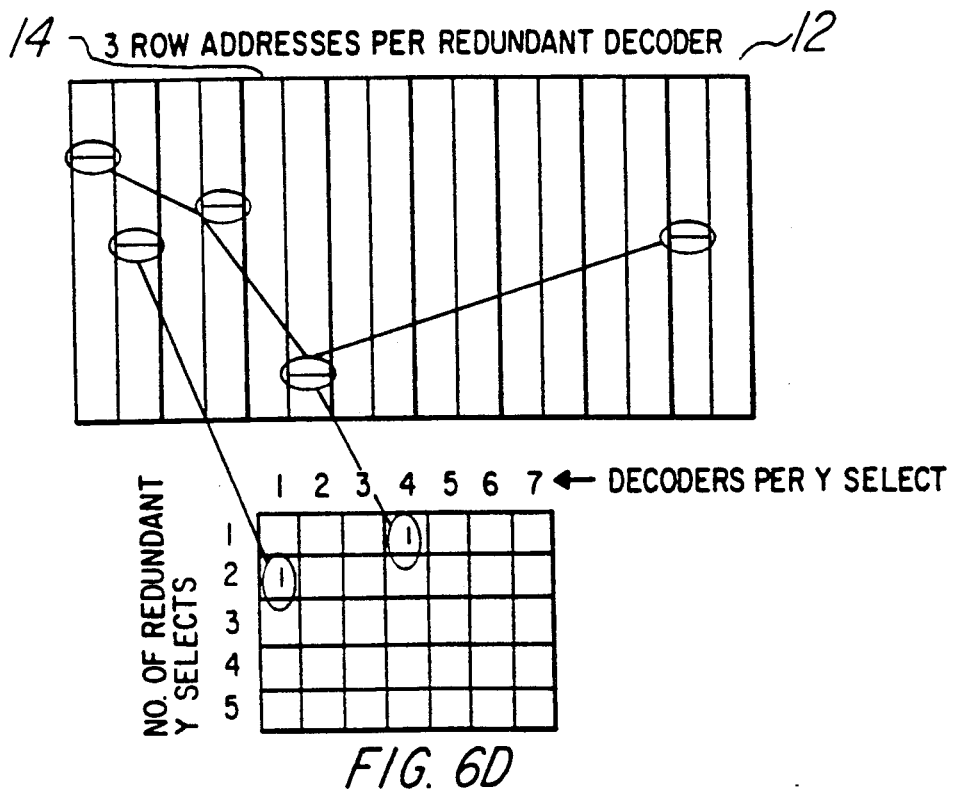
Figure 6E:
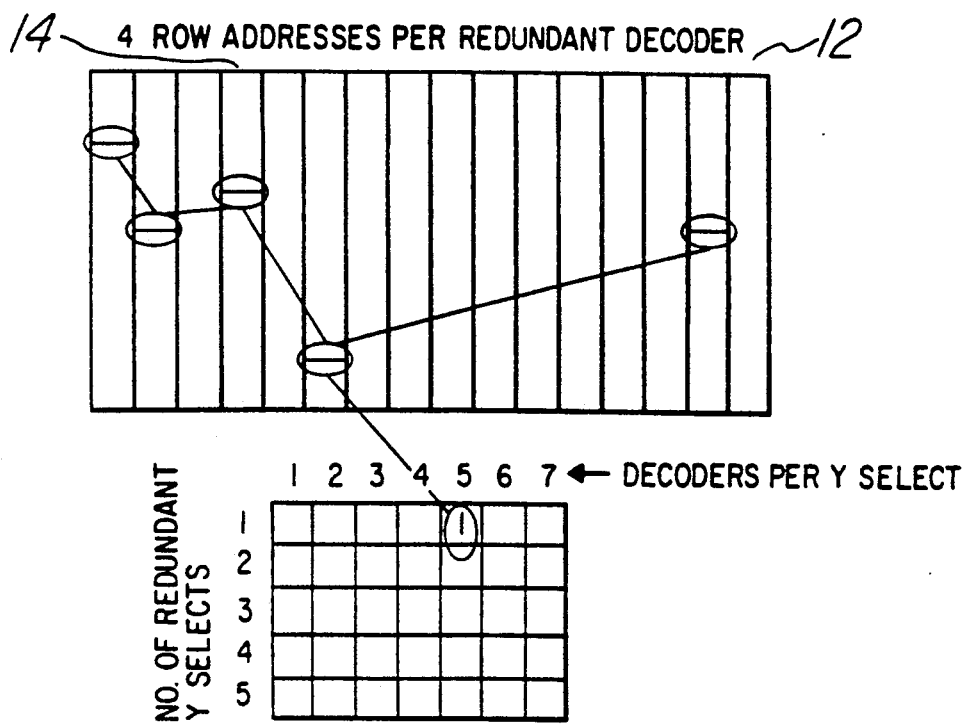

Provision of three row address bits to the comparator decoders segments the columns into eight sections (FIG. 6D), and permits four decoders per select line $Y_{RS}$. Repair of all five defects will be realized with only two select lines $Y_{RS}$, wherein at least one segment select group $SS_i$ includes four decoders. Ultimately, as shown in FIG. 6E, the comparator decoders can resolve the columns into sixteen sections (each corresponding to one sub-block 14) with four bits of row address information. When one segment select group includes five comparator decoders, all five repairs can be performed with one select line $Y_{RS}$.

Given a fixed number of redundant select lines $Y_{RS}$, the level of repairabilty for the entire device 10 can increase when both the count of comparator decoders in all of the segment select groups increases and the level of row decoding in the comparator decoders increases. FIGS. 7A through 7F illustrate trends in probability of complete repair for various device defect levels as the level of row decoding in the comparator decoders increases from zero to four bits. The numbers in brackets, e.g., [2] [2], above each graph indicate the number of decoders 40 assigned to each segment select group $SS_i$. A bracketed number is provided for each segment select group.

Figure 7A:
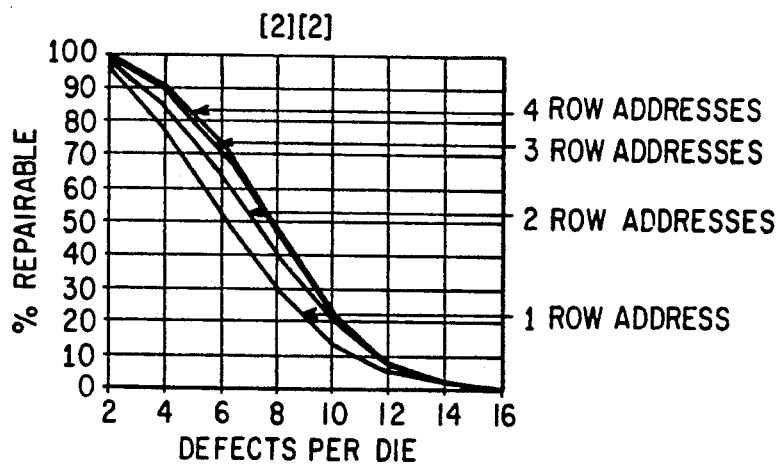
FIGS. 7A through 7F illustrate statistical trends relating to device repairability according to the invention.
Figure 7B:
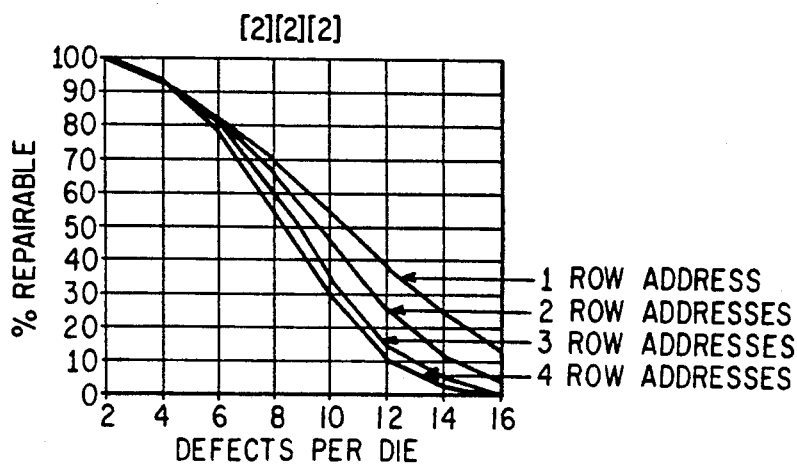
Figure 7C:
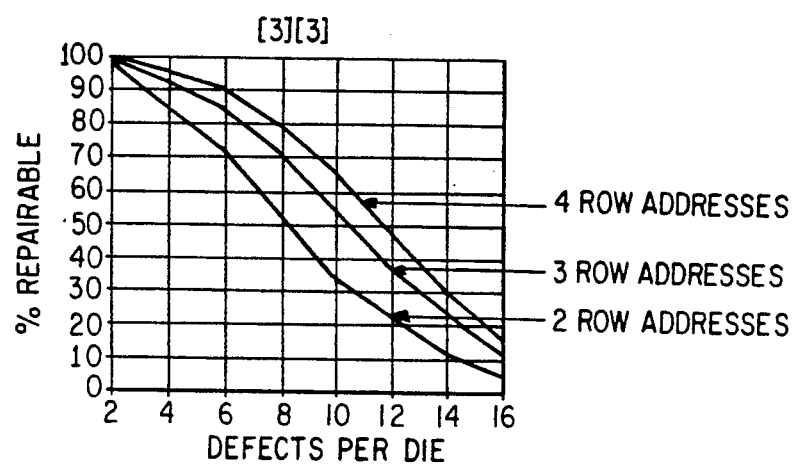
Figure 7D:
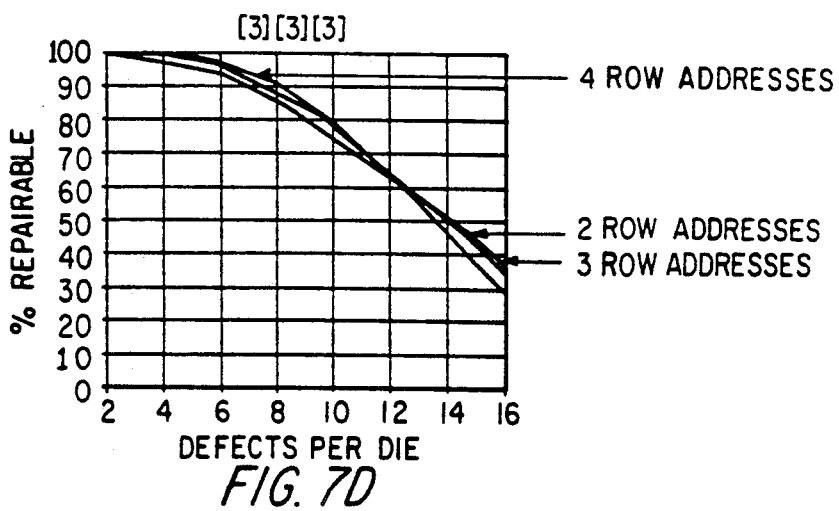
Figure 7E:
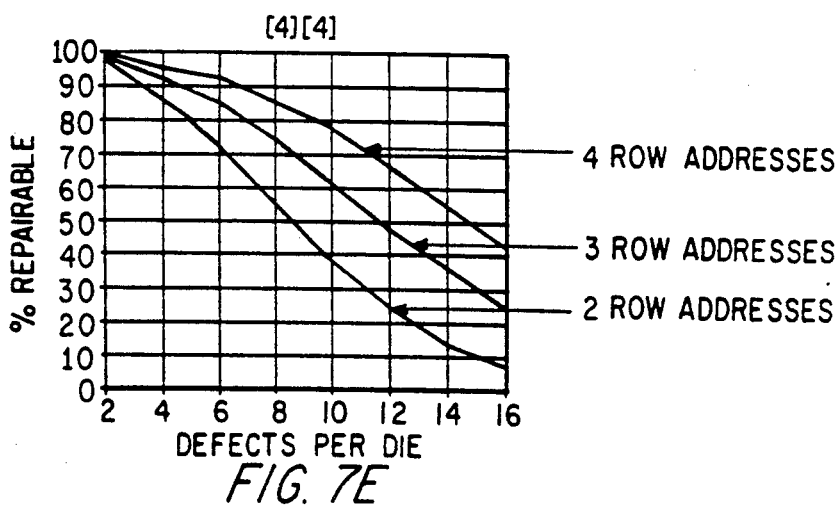
Figure 7F:
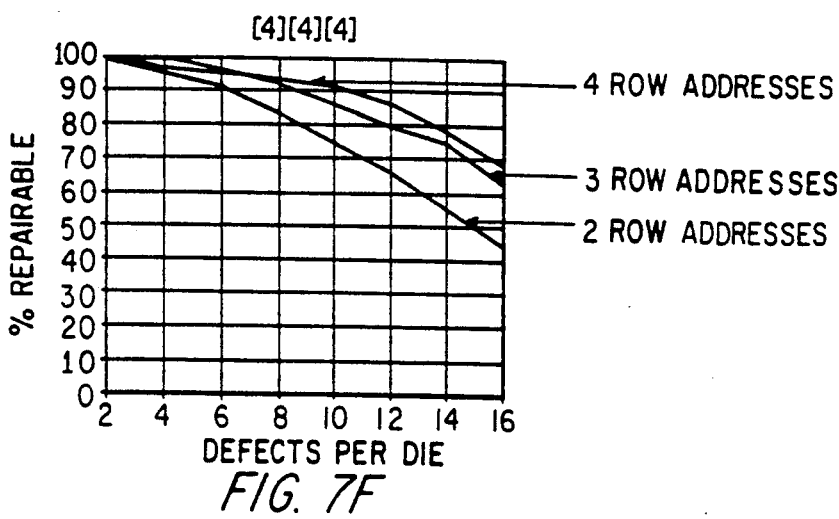

Thus, FIG. 7A illustrates improvements in repairability (as a function of row address inputs to the decoders 40) for an embodiment having two segment select groups and two decoders 40 per segment select group. FIG. 7B suggests that for the embodiment of three segment select groups, each including two decoders 40, repairability may not improve with a higher degree of segmentation. FIGS. 7D through 7F indicate improved repairability with higher levels of segmentation. The figures illustrate that repairability according to the invention is dependent on device architecture and improvements may not always be obtained. Comparison of FIGS. 7A, 7D and 7F suggests that device repairability improves as the number of decoders 40 per segment select group and the level of decoding both increase.

The data of FIGS. 6 and 7 are, of course, specific to the exemplary device as well as the defect level. In the same manner, inferences can be drawn from analysis of other device designs to identify trends in device repairability. With reference to FIG. 5 and in view of this data, one general approach for implementing a column repair scheme is to provide each segment select group $SS_i$ with the same number, Z, of decoders 40, and to incorporate a sufficient level of row decoding in each decoder 40 to achieve a satisfactory level of repairability.

For the simple example of FIGS. 6 a repair scheme for the entire device could comprise two redundant select lines $Y_{RS}$ each coupled to a different one of two segment select groups $SS_i$. The groups $SS_i$ would comprise four decoders 40 with all of the decoders receiving four bits of row address information to segment each redundant column into sixteen sections. A satisfactory level of repairability may be achievable with other combinations, e.g., three decoders per segment select group $SS_i$ with each decoder receiving three bits of row address information.

The selection of two different repair schemes which exhibit comparable levels of repairability may be based in part on space constraints. The determination of an acceptable level of repair should be made in view of yield projections as well as space constraints to avoid over design. When space constraints and other economies are not critical factors, the device can simply incorporate a sufficient number of decoders uniformly distributed among the segment select groups to assure ample repairability.

From the above discussion it is clear that one method of maximizing repair efficiency with a given number of redundant select lines in each data block is to assign multiple decoders to each of the select lines so that each line is capable of replacing up to a predetermined number of defective column portions with segments taken from a single redundant column. Thus, when presented with the problem of maximizing production yield, one approach would be to place as many redundant column select lines on a chip as permitted by the space constraints; and, uniformly distributing the decoders among the redundant lines so that each line is capable of repairing the same number of defects.

While, at first glance, this appears to be a reasonable approach to improving repairable yield, it is now apparent that such an approach will not always provide an optimum column redundancy scheme for maximizing the repairable yield. With increased complexity and density of memory devices, the above-described method of improving repair efficiency may not maximize repairable yield while utilizing as little additional space as necessary.

With probability statistics, several inferences can be drawn to predict the quantity and arrangement of redundant column select lines and decoders which will provide optimum repairability. In fact, from a repairable yield perspective, given a predetermined number of redundant column select lines and a predetermined number of decoders, it can be more effective to couple fewer decoders to one or more redundant select lines $Y_{RS}$, i.e., to turn on each redundant column RC, than to others. Further, a nonuniform distribution of a fixed number of decoders among a predetermined number of select lines $Y_{RS}$ can be of equal or greater effectiveness than a uniform distribution of the same fixed number of decoders over a larger number of select lines $Y_{RS}$. In other circumstances, depending in part on the memory architecture, it will be more effective to add an additional redundant column select line with a single decoder to a data block than it would be to add additional decoders to a fewer number of redundant column select lines.

In a second general approach for implementing a column repair scheme, several parameters can be individually or collectively varied to provide a redundancy scheme having an improved level of repairability and a more space efficient layout. Significant parameters include:

(1) the quantity and distribution of comparator decoders among the segment select groups $SS_i$;
(2) the number of sections into which a redundant column RC is addressable to replace a column C and, hence, the level of row decoding incorporated within the fusible decode circuitry;
(3) the number of redundant select lines $Y_{RS}$; and
(4) the number of redundant columns RC coupled to each select line.

The aggregate sum of redundant columns, the quantity of decoders to be provided for each redundant column, and the number of sections into which a column C is to be segmented for individual addressing, can all be optimized with probability techniques based on an assumed number of defects per device.

Figure 8:
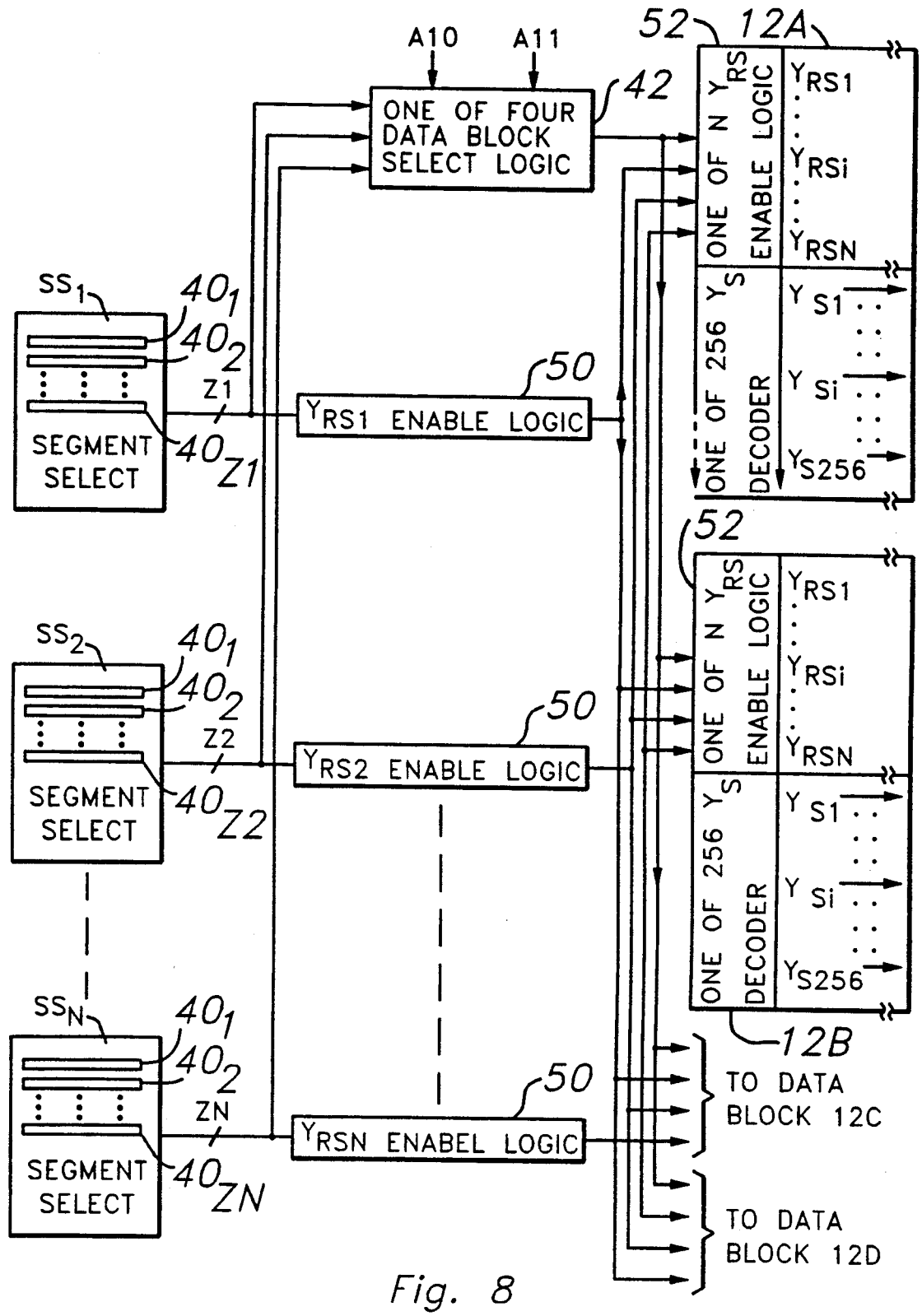
FIG. 8 illustrates a second column repair scheme according to the invention.

In addition to trends such as illustrated in FIGS. 7, the count of comparator decoders in different segment select groups $SS_i$ can be varied with respect to one another to further optimize the level of repairability for a given number of redundant select lines $Y_{RS}$. FIG. 8 illustrates a column repair scheme similar to that of FIG. 5, but wherein the distribution of comparator decoders 40 among segment select groups $SS_i$ is nonuniform. That is, Z1, Z2 . . . ZN are not all of the same value.

Based on random defect distributions and prediction analyses, it has been determined that by allocating decoder circuits to repair columns with a nonuniform distribution, the overall number of decoders can be reduced without significant loss in repairability. For some device embodiments and design constraints, a distribution can be found which provides an improved level of repairability over the FIG. 5 uniform distribution of decoders among segment select groups.

FIGS. 9A-9F illustrate improvements in probability of repair based on the distribution of decoder circuits. The figures incorporate notation similar to that of FIG. 7. That is, the numbers in brackets, e.g., [4] [2] [1] [1], indicate the number of decoders assigned to each segment select group $SS_i$. The number of brackets associated with a particular curve in a figure correspond to the number of segment select groups as well as the number of redundant select lines $Y_{RS}$. The prediction analyses assume that each select line $Y_{RS}$ turns on two redundant subcolumns RSC in each sub-block of a data block 12.

Figure 9A:
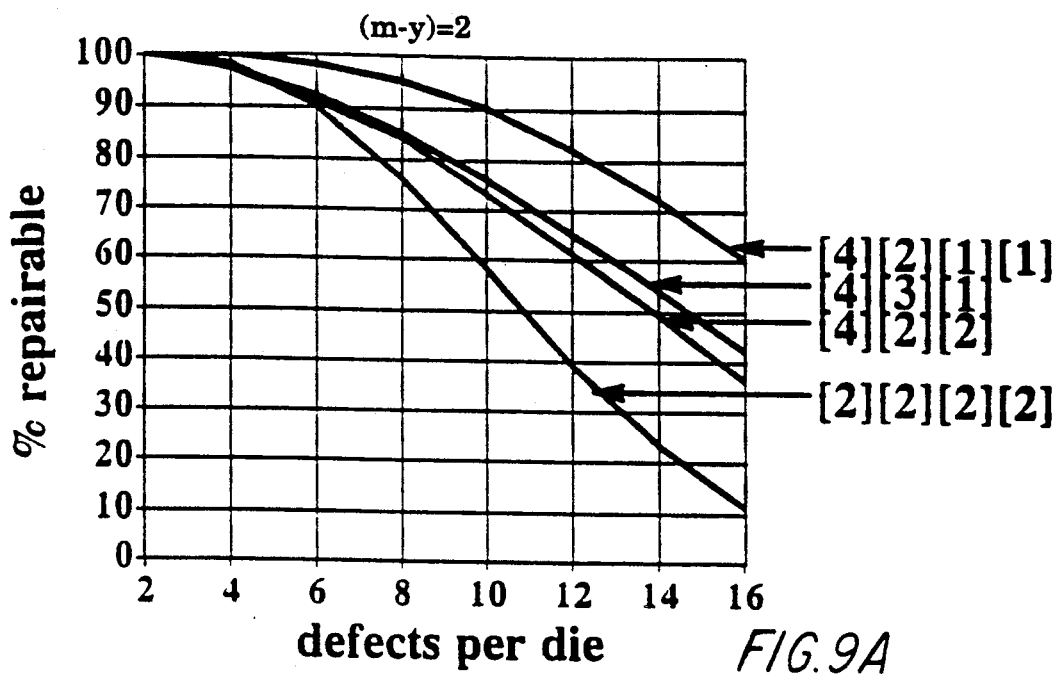
FIGS. 9A-9F illustrate improvements in probability of defect repair based on nonuniform distributions of decoder circuits.
Figure 9B:
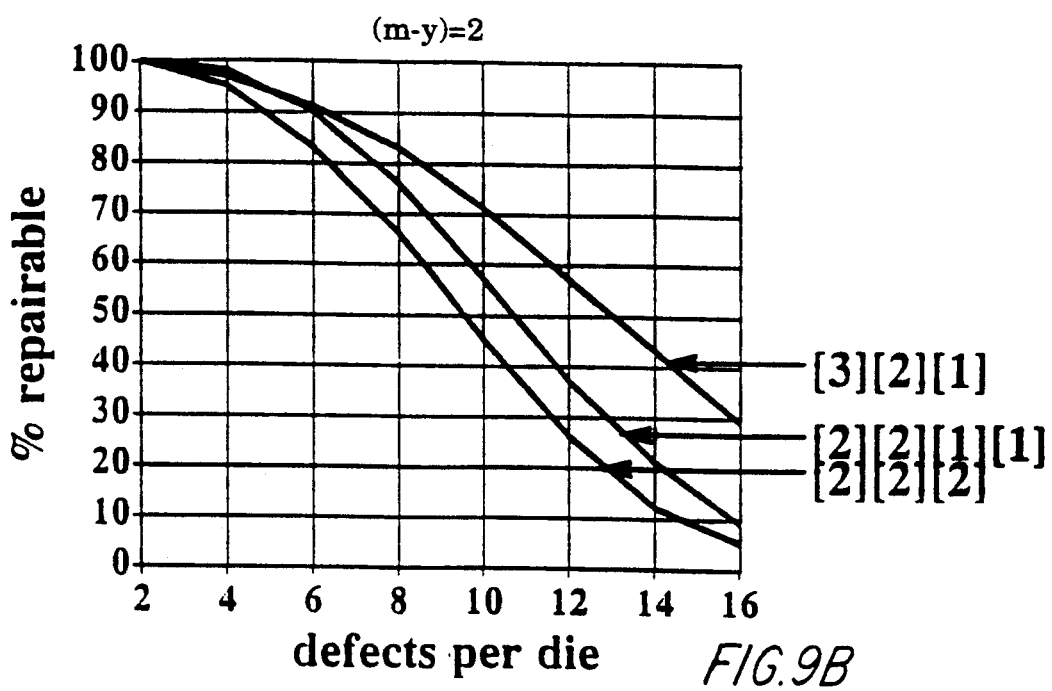

By way of example, FIGS. 9A and 9B illustrate improvements in repairability for a repair scheme wherein all of the decoder circuits include $(m-y)=2$ input circuits for receiving two row address signals. As illustrated in FIG. 6C, this level of row decoding segments the columns into four sections, each spanning four sub-blocks 14. FIG. 9A indicates, for six or more defects per die, that a nonuniform distribution of eight decoders among three redundant select lines, i.e., [4] [3] [1], provides a higher level of repairability than a uniform distribution of eight decoders among four redundant select lines, i.e., [2] [2] [2] [2]. The highest level of repairability is achieved with a nonuniform allocation of the eight decoders among four select lines, i.e., [4] [2] [1] [1]. FIG. 9B illustrates similar trends for a total of seven decoder circuits with the combination [3] [2] [1] providing the best overall repairability.

Figure 9C:
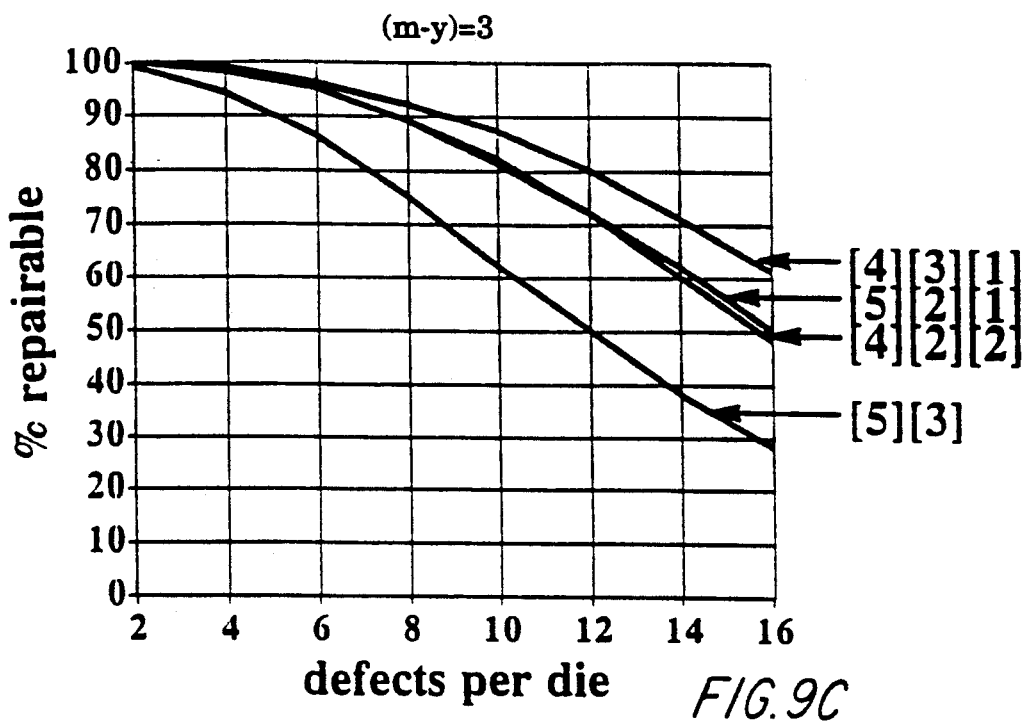
Figure 9D:
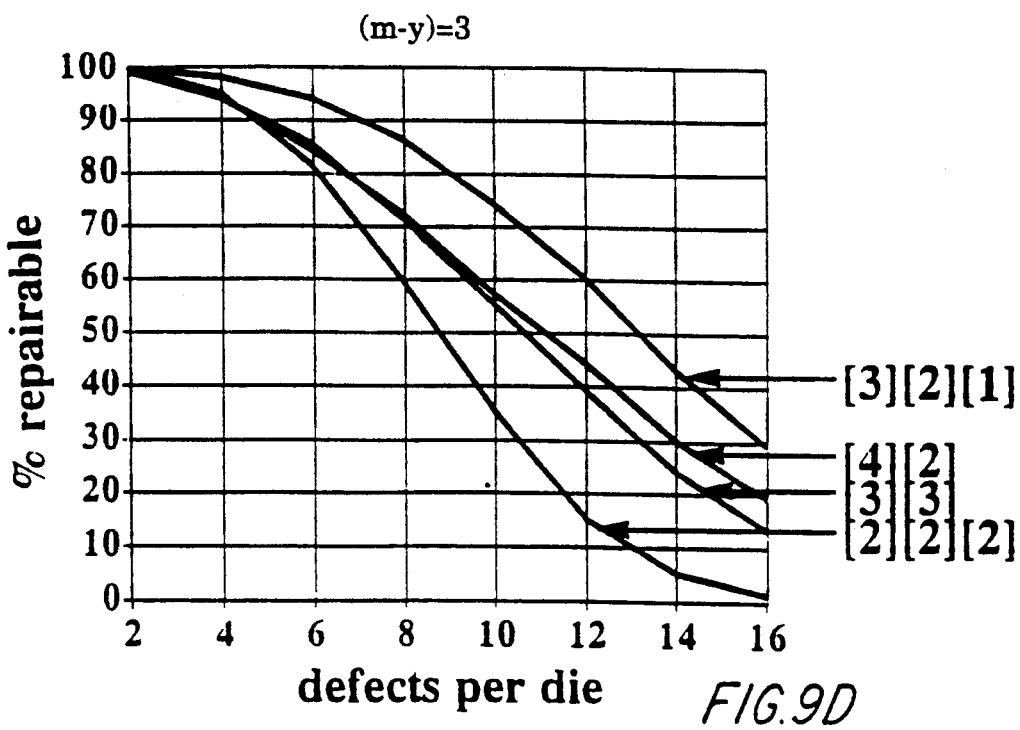
Figure 9E:
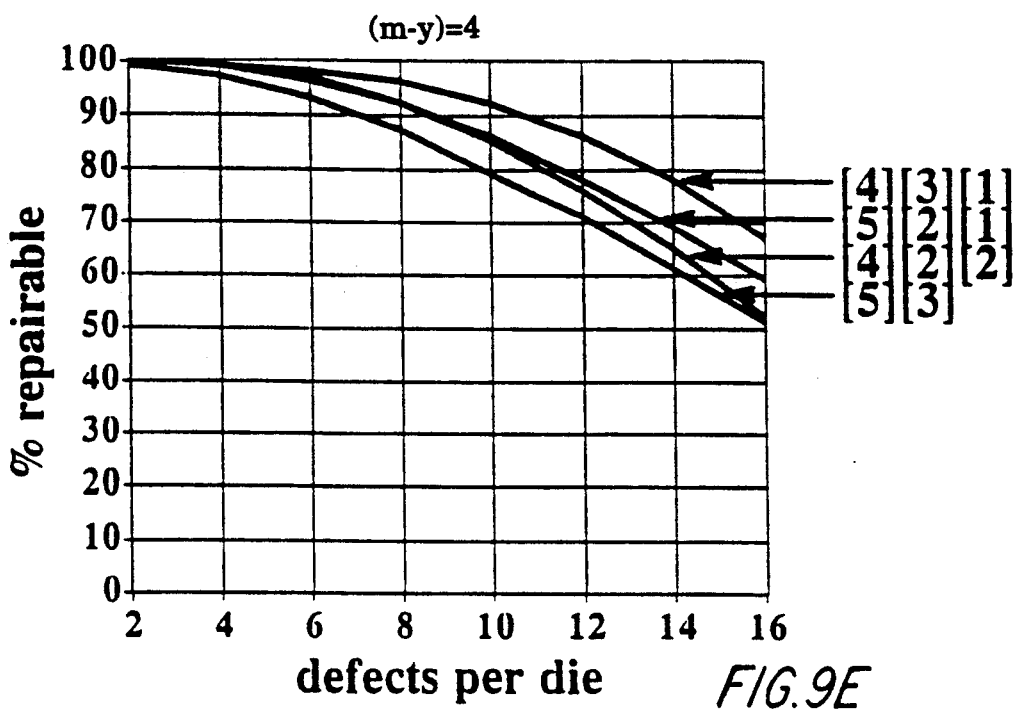
Figure 9F:
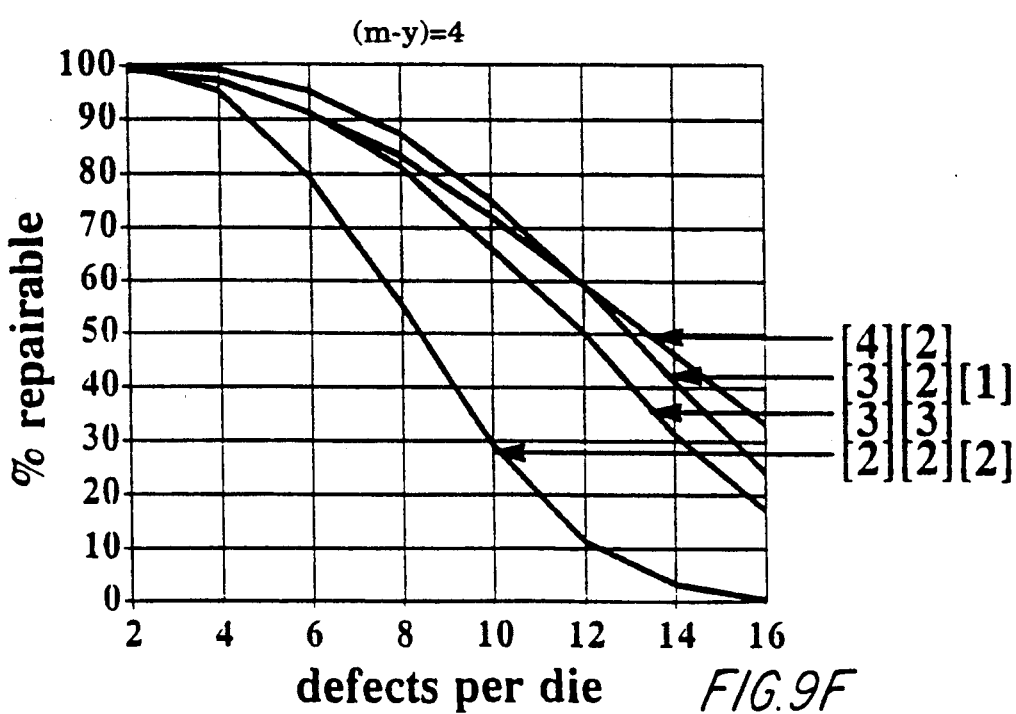

FIGS. 9C and 9D portray similar trends for a repair scheme wherein all of the decoder circuits include $(m-y)=3$ input circuits for receiving three row address signals. As illustrated in FIG. 6D, this level of row decoding segments the columns into eight sections, each spanning two sub-blocks 14. FIGS. 9E and 9F again illustrate similar trends for a repair scheme wherein all of the decoder circuits include $(m-y)=4$ input circuits for receiving four row address signals. As illustrated in FIG. 6E, this level of row decoding segments the columns into sixteen sections each corresponding to one sub-block 14. Generally, FIGS. 9A-9D confirm that the nonuniform distribution of decoders can improve repairability.

Figure 10A:
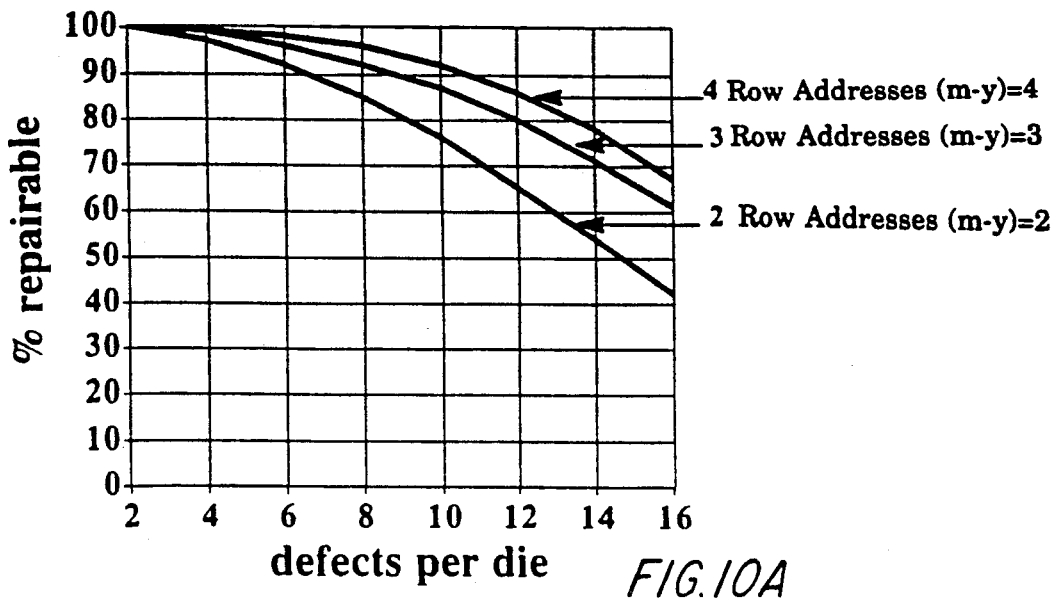
FIGS. 10A-10C illustrate improvements in the probability of defect repair based on nonuniform distributions of decoder circuits and as a function of the level of row decoding incorporated in the decoder circuitry.
Figure 10C:
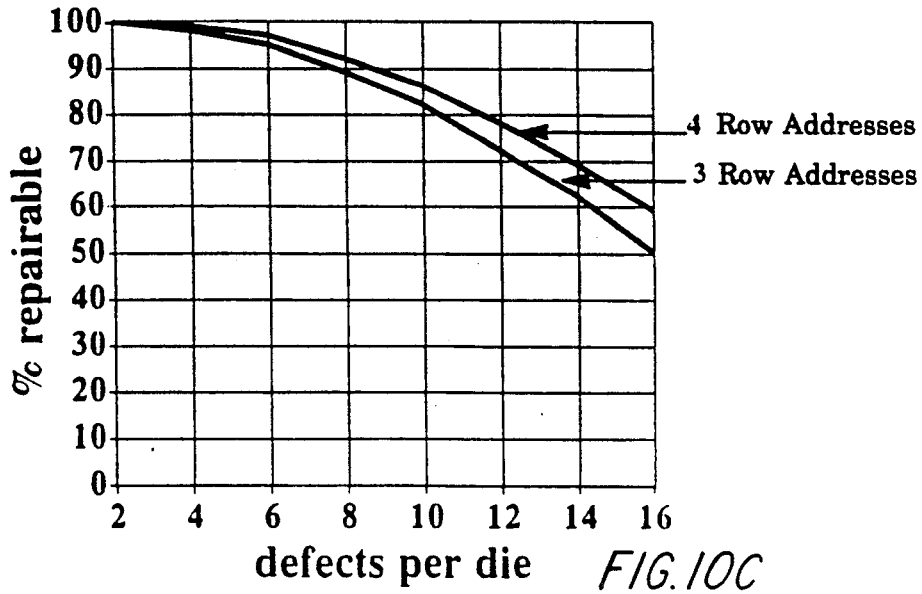
Figure 10B:
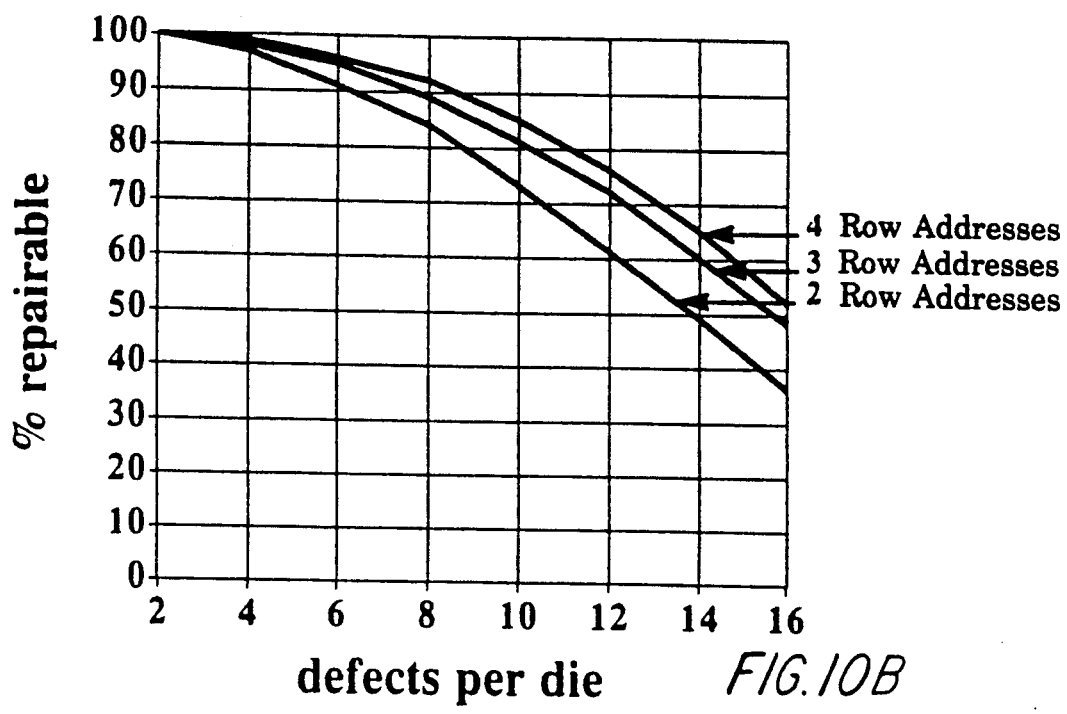

With fixed space constraints, the level of segmentation and the distribution of decoders among segment select groups can be optimized in combination to provide an improved level of repair over that achievable with the uniform distribution of decoders. FIGS. 10A and 10B illustrate improvements in the [4] [3] [1] combination and the [4] [2] [2] combination, respectively, (depicted in FIGS. 9A, 9C and 9E) as $(m-y)$ increases from two to four. FIG. 10C illustrates a similar trend for the [5] [2] [1] combination of FIGS. 9B, 9D and 9F as $(m-y)$ increases from two to four. Transposing the bracket notation of FIGS. 9 and 10 has no effect on the level of repairability, i.e., [1] [2] is equivalent to [2] [1]; and [3] [1] [4] is equivalent to [4] [3] [1].

The implementation of these concepts to provide an optimum redundancy scheme will depend on device architecture, the desired level of repairability and the cost/benefit factors associated with decoder geometry and other space constraints in the device layout. Table One illustrates numerous combinations of nonuniform decoder distributions which may be useful for improving the defect repairability or space efficiency of a defect repair scheme. The Table presents these combinations in an ascending sequence for embodiments comprising up to six redundant column select lines $Y_{RS}$ and up to five redundant decoders 40 per select line $Y_{RS}$. A continuation up to any desired level is apparent from the pattern established in Table One.

TABLE ONE

| Two Redundant Column Selects |
|---|
| [2][1] |
| [3][1] |
| [3][2] |
| [4][1] |

TABLE ONE-continued

[4][2]
[4][3]
[5][1]
[5][2]
[5][3]
[5][4]

Three Redundant Column Selects

[2][1][1]
[2][2][1]
[3][1][1]
[3][2][1]
[3][2][2]
[3][3][1]
[3][3][2]
[4][1][1]
[4][2][1]
[4][2][2]
[4][3][1]
[4][3][2]
[4][3][3]
[4][4][1]
[4][4][2]
[4][4][3]
[5][1][1]
[5][2][1]
[5][2][2]
[5][3][1]
[5][3][2]
[5][3][3]
[5][4][1]
[5][4][2]
[5][4][3]
[5][4][4]
[5][5][1]
[5][5][2]
[5][5][3]
[5][5][4]

Four Redundant Column Selects

[2][1][1][1]
[2][2][1][1]
[2][2][2][1]
[3][1][1][1]
[3][2][1][1]
[3][2][2][1]
[3][2][2][2]
[3][3][1][1]
[3][3][2][1]
[3][3][2][2]
[3][3][3][1]
[3][3][3][2]
[4][1][1][1]
[4][2][1][1]
[4][2][2][1]
[4][2][2][2]
[4][3][1][1]
[4][3][2][1]
[4][3][2][2]
[4][3][3][1]
[4][3][3][2]
[4][3][3][3]
[4][4][1][1]
[4][4][2][1]
[4][4][2][2]
[4][4][3][1]
[4][4][3][2]
[4][4][3][3]
[4][4][4][1]
[4][4][4][2]
[4][4][4][3]
[5][1][1][1]
[5][2][1][1]
[5][2][2][1]
[5][2][2][2]
[5][3][1][1]
[5][3][2][1]
[5][3][2][2]
[5][3][3][1]
[5][3][3][2]
[5][3][3][3]
[5][4][1][1]
[5][4][2][1]
[5][4][2][2]
[5][4][3][1]
[5][4][3][2]
[5][4][3][3]
[5][4][4][1]
[5][4][4][2]
[5][4][4][3]
[5][4][4][4]
[5][5][1][1]
[5][5][2][1]
[5][5][2][2]
[5][5][3][1]
[5][5][3][2]
[5][5][3][3]
[5][5][4][1]
[5][5][4][2]
[5][5][4][3]
[5][5][4][4]
[5][5][5][1]
[5][5][5][2]
[5][5][5][3]
[5][5][5][4]

Five Redundant Column Selects

[2][1][1][1][1]
[2][2][1][1][1]
[2][2][2][1][1]
[2][2][2][2][1]
[3][1][1][1][1]
[3][2][1][1][1]
[3][2][2][1][1]
[3][2][2][2][1]
[3][2][2][2][2]
[3][3][1][1][1]
[3][3][2][1][1]
[3][3][2][2][1]
[3][3][2][2][2]
[3][3][3][1][1]
[3][3][3][2][1]
[3][3][3][2][2]
[3][3][3][3][1]
[3][3][3][3][2]
[4][1][1][1][1]
[4][2][1][1][1]
[4][2][2][1][1]
[4][2][2][2][1]
[4][2][2][2][2]
[4][3][1][1][1]
[4][3][2][1][1]
[4][3][2][2][1]
[4][3][2][2][2]
[4][3][3][1][1]
[4][3][3][2][1]
[4][3][3][2][2]
[4][3][3][3][1]
[4][3][3][3][2]
[4][3][3][3][3]
[4][4][1][1][1]
[4][4][2][1][1]
[4][4][2][2][1]
[4][4][2][2][2]
[4][4][3][1][1]
[4][4][3][2][1]
[4][4][3][2][2]
[4][4][3][3][1]
[4][4][3][3][2]
[4][4][3][3][3]
[4][4][4][1][1]
[4][4][4][2][1]
[4][4][4][2][2]
[4][4][4][3][1]
[4][4][4][3][2]
[4][4][4][3][3]
[4][4][4][4][1]
[4][4][4][4][2]
[4][4][4][4][3]
[5][1][1][1][1]
[5][2][1][1][1]
[5][2][2][1][1]
[5][2][2][2][1]
[5][2][2][2][2]

TABLE ONE-continued

[5][3][1][1][1]
[5][3][2][1][1]
[5][3][2][2][1]
[5][3][2][2][2]
[5][3][3][1][1]
[5][3][3][2][1]
[5][3][3][2][2]
[5][3][3][3][1]
[5][3][3][3][2]
[5][3][3][3][3]
[5][4][1][1][1]
[5][4][2][1][1]
[5][4][2][2][1]
[5][4][2][2][2]
[5][4][3][1][1]
[5][4][3][2][1]
[5][4][3][2][2]
[5][4][3][3][1]
[5][4][3][3][2]
[5][4][3][3][3]
[5][4][4][1][1]
[5][4][4][2][1]
[5][4][4][2][2]
[5][4][4][3][1]
[5][4][4][3][2]
[5][4][4][3][3]
[5][4][4][4][1]
[5][4][4][4][2]
[5][4][4][4][3]
[5][4][4][4][4]
[5][5][1][1][1]
[5][5][2][1][1]
[5][5][2][2][1]
[5][5][2][2][2]
[5][5][3][1][1]
[5][5][3][2][1]
[5][5][3][2][2]
[5][5][3][3][1]
[5][5][3][3][2]
[5][5][3][3][3]
[5][5][4][1][1]
[5][5][4][2][1]
[5][5][4][2][2]
[5][5][4][3][1]
[5][5][4][3][2]
[5][5][4][3][3]
[5][5][4][4][1]
[5][5][4][4][2]
[5][5][4][4][3]
[5][5][4][4][4]
[5][5][5][1][1]
[5][5][5][2][1]
[5][5][5][2][2]
[5][5][5][3][1]
[5][5][5][3][2]
[5][5][5][3][3]
[5][5][5][4][1]
[5][5][5][4][2]
[5][5][5][4][3]
[5][5][5][4][4]
[5][5][5][5][1]
[5][5][5][5][2]
[5][5][5][5][3]
[5][5][5][5][4]

Six Redundant Column Selects

[2][1][1][1][1][1]
[2][2][1][1][1][1]
[2][2][2][1][1][1]
[2][2][2][2][1][1]
[2][2][2][2][2][1]
[3][1][1][1][1][1]
[3][2][1][1][1][1]
[3][2][2][1][1][1]
[3][2][2][2][1][1]
[3][2][2][2][2][1]
[3][2][2][2][2][2]
[3][3][1][1][1][1]
[3][3][2][1][1][1]
[3][3][2][2][1][1]
[3][3][2][2][2][1]
[3][3][2][2][2][2]
[3][3][3][1][1][1]

TABLE ONE-continued

[3][3][3][2][1][1]
[3][3][3][2][2][1]
[3][3][3][2][2][2]
[3][3][3][3][1][1]
[3][3][3][3][2][1]
[3][3][3][3][2][2]
[3][3][3][3][3][1]
[3][3][3][3][3][2]
[4][1][1][1][1][1]
[4][2][1][1][1][1]
[4][2][2][1][1][1]
[4][2][2][2][1][1]
[4][2][2][2][2][1]
[4][2][2][2][2][2]
[4][3][1][1][1][1]
[4][3][2][1][1][1]
[4][3][2][2][1][1]
[4][3][2][2][2][1]
[4][3][2][2][2][2]
[4][3][3][1][1][1]
[4][3][3][2][1][1]
[4][3][3][2][2][1]
[4][3][3][2][2][2]
[4][3][3][3][1][1]
[4][3][3][3][2][1]
[4][3][3][3][2][2]
[4][3][3][3][3][1]
[4][3][3][3][3][2]
[4][3][3][3][3][3]
[4][4][1][1][1][1]
[4][4][2][1][1][1]
[4][4][2][2][1][1]
[4][4][2][2][2][1]
[4][4][2][2][2][2]
[4][4][3][1][1][1]
[4][4][3][2][1][1]
[4][4][3][2][2][1]
[4][4][3][2][2][2]
[4][4][3][3][1][1]
[4][4][3][3][2][1]
[4][4][3][3][2][2]
[4][4][3][3][3][1]
[4][4][3][3][3][2]
[4][4][3][3][3][3]
[4][4][4][1][1][1]
[4][4][4][2][1][1]
[4][4][4][2][2][1]
[4][4][4][2][2][2]
[4][4][4][3][1][1]
[4][4][4][3][2][1]
[4][4][4][3][3][1]
[4][4][4][3][3][2]
[4][4][4][3][3][3]
[4][4][4][4][1][1]
[4][4][4][4][2][1]
[4][4][4][4][2][2]
[4][4][4][4][3][1]
[4][4][4][4][3][2]
[4][4][4][4][3][3]
[4][4][4][4][4][1]
[4][4][4][4][4][2]
[4][4][4][4][4][3]
[5][1][1][1][1][1]
[5][2][1][1][1][1]
[5][2][2][1][1][1]
[5][2][2][2][2][1]
[5][2][2][2][2][2]
[5][3][1][1][1][1]
[5][3][2][1][1][1]
[5][3][2][2][1][1]
[5][3][2][2][2][1]
[5][3][2][2][2][2]
[5][3][3][1][1][1]
[5][3][3][2][1][1]
[5][3][3][2][2][1]
[5][3][3][2][2][2]
[5][3][3][3][1][1]
[5][3][3][3][2][1]
[5][3][3][3][2][2]
[5][3][3][3][3][1]
[5][3][3][3][3][2]
[5][3][3][3][3][3]

TABLE ONE-continued

[5][4][1][1][1][1]
[5][4][2][1][1][1]
[5][4][2][2][1][1]
[5][4][2][2][2][1]
[5][4][2][2][2][2]
[5][4][3][1][1][1]
[5][4][3][2][1][1]
[5][4][3][2][2][1]
[5][4][3][2][2][2]
[5][4][3][3][1][1]
[5][4][3][3][2][1]
[5][4][3][3][2][2]
[5][4][3][3][3][1]
[5][4][3][3][3][2]
[5][4][3][3][3][3]
[5][4][4][1][1][1]
[5][4][4][2][1][1]
[5][4][4][2][2][1]
[5][4][4][2][2][2]
[5][4][4][3][1][1]
[5][4][4][3][2][1]
[5][4][4][3][2][2]
[5][4][4][3][3][1]
[5][4][4][3][3][2]
[5][4][4][3][3][3]
[5][4][4][4][1][1]
[5][4][4][4][2][1]
[5][4][4][4][2][2]
[5][4][4][4][3][1]
[5][4][4][4][3][2]
[5][4][4][4][3][3]
[5][4][4][4][4][1]
[5][4][4][4][4][2]
[5][4][4][4][4][3]
[5][4][4][4][4][4]
[5][5][1][1][1][1]
[5][5][2][1][1][1]
[5][5][2][2][1][1]
[5][5][2][2][2][1]
[5][5][2][2][2][2]
[5][5][3][1][1][1]
[5][5][3][2][1][1]
[5][5][3][2][2][1]
[5][5][3][2][2][2]
[5][5][3][3][1][1]
[5][5][3][3][2][1]
[5][5][3][3][2][2]
[5][5][3][3][3][1]
[5][5][3][3][3][2]
[5][5][3][3][3][3]
[5][5][4][1][1][1]
[5][5][4][2][1][1]
[5][5][4][2][2][1]
[5][5][4][2][2][2]
[5][5][4][3][1][1]
[5][5][4][3][2][1]
[5][5][4][3][2][2]
[5][5][4][3][3][1]
[5][5][4][3][3][2]
[5][5][4][3][3][3]
[5][5][4][4][1][1]
[5][5][4][4][2][1]
[5][5][4][4][2][2]
[5][5][4][4][3][1]
[5][5][4][4][3][2]
[5][5][4][4][3][3]
[5][5][4][4][4][1]
[5][5][4][4][4][2]
[5][5][4][4][4][3]
[5][5][4][4][4][4]
[5][5][5][1][1][1]
[5][5][5][2][1][1]
[5][5][5][2][2][1]
[5][5][5][2][2][2]
[5][5][5][3][1][1]
[5][5][5][3][2][1]
[5][5][5][3][2][2]
[5][5][5][3][3][1]
[5][5][5][3][3][2]
[5][5][5][3][3][3]
[5][5][5][4][1][1]
[5][5][5][4][2][1]

TABLE ONE-continued

[5][5][5][4][2][2]
[5][5][5][4][3][1]
[5][5][5][4][3][2]
[5][5][5][4][3][3]
[5][5][5][4][4][1]
[5][5][5][4][4][2]
[5][5][5][4][4][3]
[5][5][5][4][4][4]
[5][5][5][5][1][1]
[5][5][5][5][2][1]
[5][5][5][5][2][2]
[5][5][5][5][3][1]
[5][5][5][5][3][2]
[5][5][5][5][3][3]
[5][5][5][5][4][1]
[5][5][5][5][4][2]
[5][5][5][5][4][3]
[5][5][5][5][4][4]
[5][5][5][5][5][1]
[5][5][5][5][5][2]
[5][5][5][5][5][3]
[5][5][5][5][5][4]

ADVANTAGES AND MODIFICATIONS

From the above description, it can be seen that a method of maximizing repair efficiency with a given number of redundant select lines in each data block involves assigning multiple decoders to each of the redundant select lines so that each line is capable of replacing multiple defective column portions with redundant column portions that are coupled to the same select line. A nonuniform distribution of decoder circuits among the select lines may further improve the efficiency of repair and lead to space saving economies.

The definitions of rows, row lines, columns, subcolumns and select lines as used to describe certain embodiments of the invention are not to be construed as limiting the invention. Rather, it is recognized that the many possible variations in device architecture will alter the meanings of these and other terms. Further, the exemplary application of the inventive concepts to what is commonly referred to as column repair does not limit the invention to such. As an example, for various device types, e.g., SRAMs, as well as for simpler device architectures, redundant row repair schemes could include the feature of incorporating column address information in the decoder repair circuitry to replace sections of rows of memory cells containing defects with sections of redundant rows. Thus, in defining the invention, the meanings of the terms column and row as used in this detailed description and the claims which follow are not limited based on geometric orientation or electrical connection and, unless otherwise restricted, the meanings of these terms are interchangeable.

In describing the feature of decoding row address information in the column repair circuitry the terms section, portion and segment as used herein with regard to a column C or a redundant column RC, each comprehend less than a full column of memory cells and fewer than all of the memory cells connected along one column select line. When interchanging the meanings of the terms row and column the terms section, portion and segment define less than a full row of memory cells or fewer than all of the memory cells along a particular row line.

With consideration to the space constraints present on high density, e.g., sixteen Megabit, devices, redundancy schemes can be optimized for space efficiency as well as repairability. The desirability of minimizing the geometric size of a redundancy scheme stems from the space consuming nature of fuses which are used to program the decoders 40. Even though portions of device circuitry are based on sub-micron line widths, fuse lines for redundant decoders are significantly wider, e.g., one to two microns on center. Further, to avoid electrical shorts between fuses, as well as between fuse lines and adjacent circuitry, layouts have spaced fuse lines seven microns on center from adjacent fuse lines or other conductors. Thus, the space requirement for fusible decoders can be substantial and will increase in direct relation to the level of decoding incorporated to replace defective column sections with corresponding sections of redundant columns.

For these reasons, it may be undesirable to repeat for each logical data block all of the programmable support circuitry, e.g., the decoders 40, needed to replace defective cells. Indeed, it has been illustrated that the sharing of redundant column select signals among the data blocks provides economies in the device layout. On the other hand, this sharing complicates the redundancy schemes and so reduces the efficiency of repair that-,overall, a larger number of redundant columns may be needed to offset the loss in efficiency of repair. That is, when the redundant column decode circuits are each common to all of the data blocks, at least one column in each data block will share the same select line signal. Segmentation of repair lines overcomes this disadvantage.

In a simple embodiment of the invention, when a defective section in one data block is to be replaced with a redundant section, corresponding sections in the other data blocks could also be replaced by redundant sections that are coupled to the same decoder. Thus replacement of a column section along one data block could require replacement of all corresponding column sections in the other data blocks. More certainly, when a redundant column section in each of several different data blocks shares a common redundant decoder, the assignment of one of those redundant column sections to a specific address constrains assignment of the other redundant column sections in the other data blocks to the same address. With this address dedication scheme the usefulness of a redundant column section in a particular data block which could otherwise be used to replace a defective column section may appear lost.

In redundancy schemes wherein redundant column decoders are shared among several data blocks, the efficiency of column repair can be further improved upon by incorporating additional information within the comparator decoders, e.g., data block designation, to further define where a defect is located and dedicate a portion of only one redundant column each time a decoder is programmed. With this approach a segment of a redundant column will not be used to replace a good segment of a column C. Rather, an addressed segment of a redundant column will be activated only when the corresponding defective segment of a single column, i.e., in only one data block, is addressed.

To implement this feature in the device 10, the comparator decoders 40 of FIGS. 4 and 5 would include additional fusing and address inputs in order to respond to two bits of data block address information (CA10, CA11). With such modification, repair segments located in different data blocks, comprising redundant subcolumns connected to the same select line $Y_{RS}$ and identifiable with the same row address information, can be assigned different column address information so that each may be used to replace a defective column portion having a different column address, i.e., A0 through A7.

While the invention has been shown and described with reference to a particular memory device and specific embodiments of repair schemes, it will be understood by those skilled in the art that many changes in design and detail may be made without departing from the spirit and scope of the invention which is limited only by the claims which follow.

I claim:

1. A memory device formed with at least one memory block, each memory block having individual input-/output paths and comprising:
   an array of memory cells arranged in rows and columns and configured in sub-blocks, each sub-block comprising a plurality of memory cells arranged in rows and sub-columns;
   row address circuitry for selecting a row of memory cells;
   column address circuitry for selecting a memory cell in a column which intersects a selected row;
   a plurality of redundant memory cells arranged in a plurality of redundant columns, each redundant column including a redundant sub-column for each sub-block of memory cells in the respective memory block; and
   address repair circuitry for addressing redundant sub-columns, said address repair circuitry comprising multiple decoders which are connected to the plurality of redundant columns nonuniformly such that more decoders are coupled to one of the redundant columns than another of the redundant columns, each of the multiple decoders programmable for selecting a redundant sub-column based on a sub-column address.

2. A memory device formed with a plurality of data blocks having individual input/output paths, a first of the data blocks comprising:
   an array of memory cells arranged in addressable rows and columns along row lines and column lines and configured in sub-blocks, each sub-block comprising a plurality of memory cells;
   a group of redundant memory cells arranged along the row and column lines of the array and forming a plurality of repair columns of memory cells;
   row address circuitry for selecting a row of the memory cells in said array based on row address information;
   column address circuitry for selecting a memory cell in a column which intersects a selected row; and
   a plurality of column repair decoder circuits that are connected to the plurality of repair columns and are programmable with column and row address information corresponding to a section of an array column containing a defective memory cell to replace the defective memory cell with a memory cell from one of the plurality of repair columns, a first of the plurality of repair columns connected to a different number of column repair decoder circuits than a second of the plurality of repair columns so that the distribution of column repair decoder circuits that is connected to the plurality of repair columns is nonuniform.

3. A memory block, comprising:
   a plurality of sub-blocks of memory cells arranged in rows and columns that are selectable through row address information and column address information;

redundant memory cells arranged in a plurality of redundant columns;

row address circuitry for selecting a row of memory cells in response to a row address;

column address circuitry for selecting a column of memory cells in response to a column address; and a plurality of redundant column selection circuits coupled to the plurality of redundant columns of redundant memory cells, a first redundant column of redundant memory cells coupled to a different number of redundant column selection circuits than a second redundant column of redundant memory cells.

4. The memory block of claim 3 wherein the plurality of redundant column selection circuits are programmable to hold row addresses of defective memory cells within the sub-blocks of memory cells so that a column of redundant memory cells may be used to replace defective memory cells residing in more than one memory sub-block.

5. A memory device comprising:

a memory array having addressable memory cells;

addressable redundant columns of redundant memory cells for replacing defective memory cells in the memory array;

a plurality of decoders coupled to the addressable redundant columns of redundant memory cells for decoding addresses of the defective memory cells in the memory array and for selecting addressable redundant sub-columns of redundant memory cells to replace the defective memory cells; and wherein the plurality of decoders are coupled to the addressable redundant columns of redundant memory cells nonuniformly such that some of the addressable redundant columns of redundant memory cells have more decoders coupled to them than another of the addressable redundant columns.

6. A redundancy arrangement for a random access memory device having an array of memory cells that is organized into sub-blocks of memory that contain rows and columns of the memory cells, comprising:

a group of redundant memory cells organized into columns so that a defective column of memory cells of a sub-block of memory may be replaced with a redundant column of memory cells; and a plurality of redundant column decoders connected to the columns of redundant memory cells with one column of redundant memory cells connected to more redundant column decoders than another column of redundant memory cells, thereby yielding a nonuniform distribution of redundant column decoders.

7. A memory device comprising:

a memory array having addressable memory cells;

addressable columns of redundant memory cells for replacing defective memory cells in the memory array;

a plurality of decoders connected to the plurality of addressable columns of redundant memory cells for decoding column and at least partial row addresses of the defective memory cells in the memory array to select the addressable redundant memory cells as replacements for the defective memory cells in the memory array, the plurality of decoders being connected nonuniformly to the addressable columns of redundant memory cells so that at least one of the addressable columns of redundant memory cells is connected to more decoders than another of the addressable columns of redundant memory cells.

8. A memory block comprising:

a plurality of sub-blocks of memory cells arranged in addressable rows and columns;

redundant memory cells arranged in redundant columns;

row address circuitry for selecting a row of the memory cells in response to a row address;

column address circuitry for selecting a column of memory cells in response to a column address; and a plurality of redundant column selection circuits that are coupled to the redundant columns of redundant memory cells for addressing redundant sub-columns, in response to array sub-column address, the redundant column selection circuits including multiple decoders connected to the redundant columns of redundant memory cells so that at least one of the redundant columns is connected to more decoders than another of the redundant columns.

* * * * *